(12) United States Patent
Takimoto

(10) Patent No.: US 8,912,579 B2
(45) Date of Patent: Dec. 16, 2014

(54) SOLID-STATE IMAGE PICKUP DEVICE, METHOD OF MANUFACTURING SOLID-STATE IMAGE PICKUP DEVICE, AND ELECTRONIC APPARATUS

(75) Inventor: Kaori Takimoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 252 days.

(21) Appl. No.: 13/313,721

(22) Filed: Dec. 7, 2011

(65) Prior Publication Data

US 2012/0188431 A1    Jul. 26, 2012

(30) Foreign Application Priority Data

Jan. 26, 2011 (JP) ................ P2011-014520

(51) Int. Cl.
*H01L 27/148* (2006.01)
*H01L 27/146* (2006.01)

(52) U.S. Cl.
CPC .... *H01L 27/14818* (2013.01); *H01L 27/14683* (2013.01); *H01L 27/14843* (2013.01); *H01L 27/1462* (2013.01)
USPC ..... 257/233; 257/299; 257/461; 257/E31.119

(58) Field of Classification Search
USPC ............ 257/290–294, 233, 461, E31.119, 257/E31.082, E31.084
See application file for complete search history.

(56) References Cited

U.S. PATENT DOCUMENTS

2001/0032988 A1*  10/2001  Yoshida et al. ............. 257/226
2009/0250728 A1  10/2009  Mizuno et al.

FOREIGN PATENT DOCUMENTS

| JP | 11-186204 | 7/1999 |
| JP | 2000-081402 | 3/2000 |
| JP | 2009-252840 | 10/2009 |

* cited by examiner

*Primary Examiner* — Kenneth Parker
*Assistant Examiner* — Jose R Diaz
(74) *Attorney, Agent, or Firm* — Rader, Fishman & Grauer PLLC

(57) ABSTRACT

A solid-state image pickup device includes: a photoelectric conversion portion formed on a substrate and composed of a photodiode; an image pickup area in which plural pixels each including a reading-out electrode for reading out signal electric charges generated and accumulated in the photoelectric conversion portion are formed; and a light blocking film having an opening portion right above the photoelectric conversion portion in an effective pixel area of the image pickup area, and light-blocking said photoelectric conversion portion in an OB pixel area of the image pickup area, in which a film deposited between the light blocking film and the substrate right above the photoelectric conversion portion in the OB pixel area is composed of only a silicon oxide film.

10 Claims, 25 Drawing Sheets

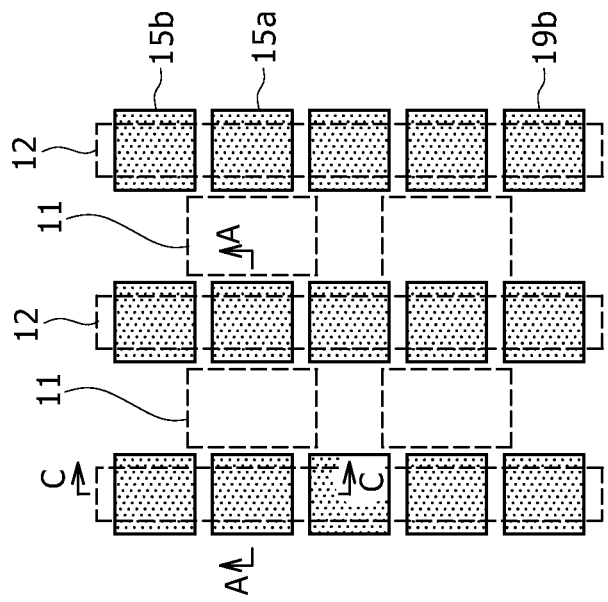
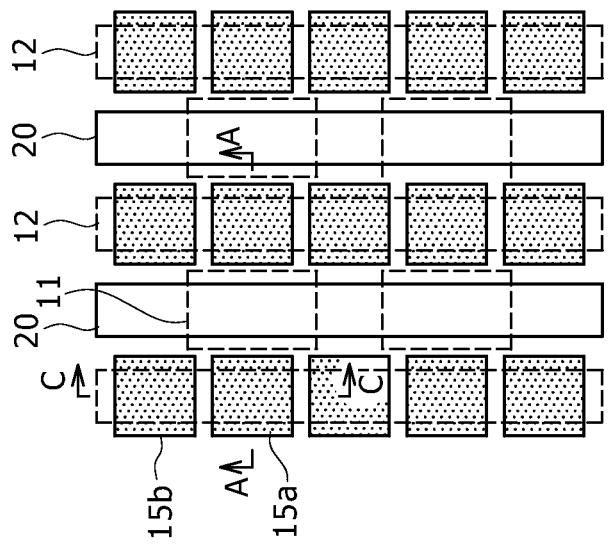

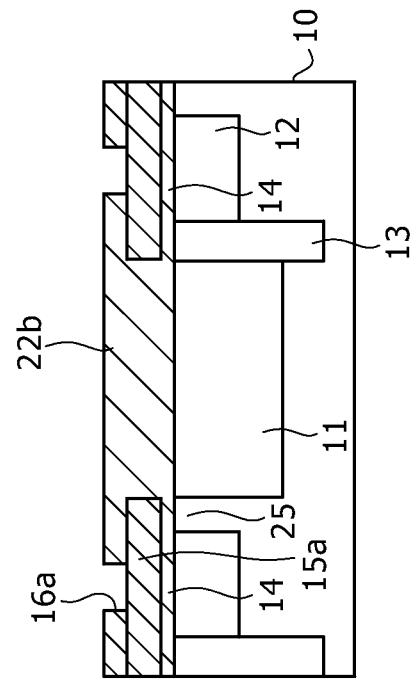
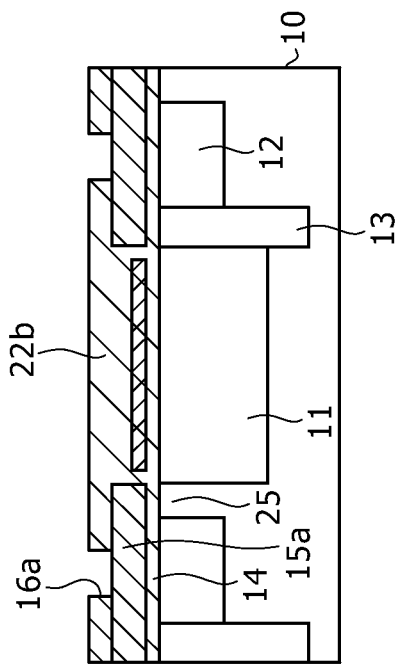
FIG. 9A
FIG. 9B

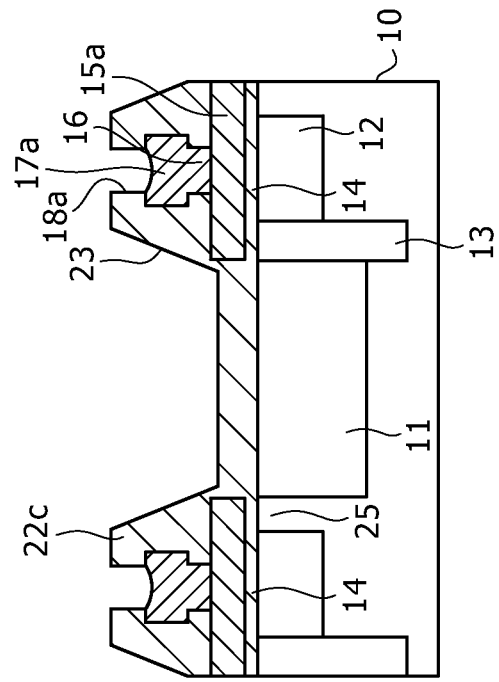
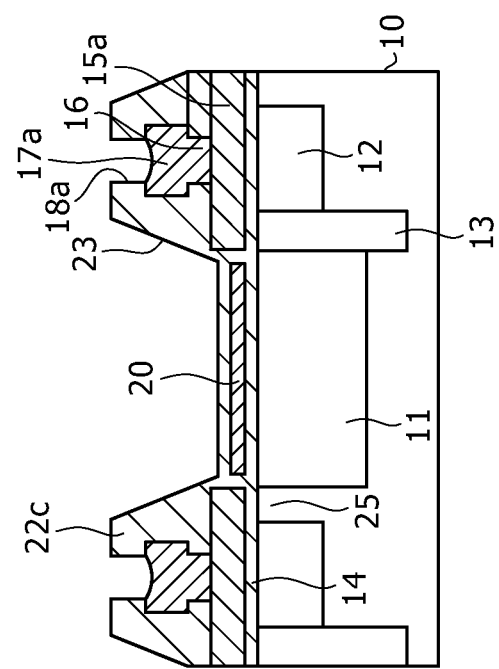

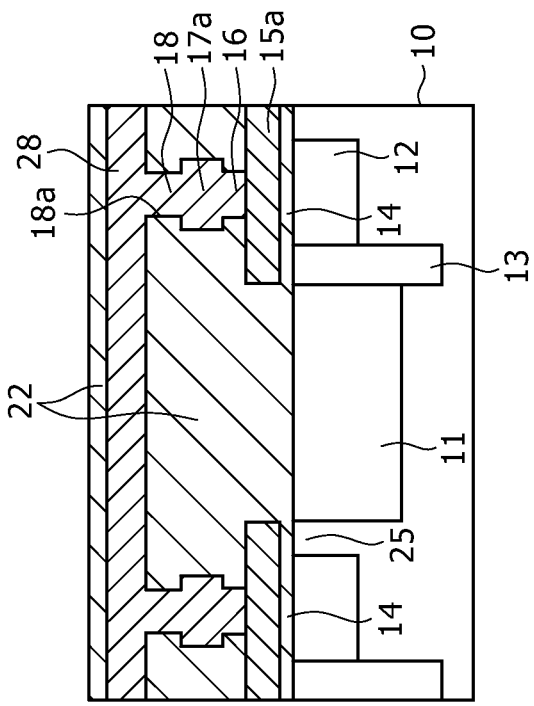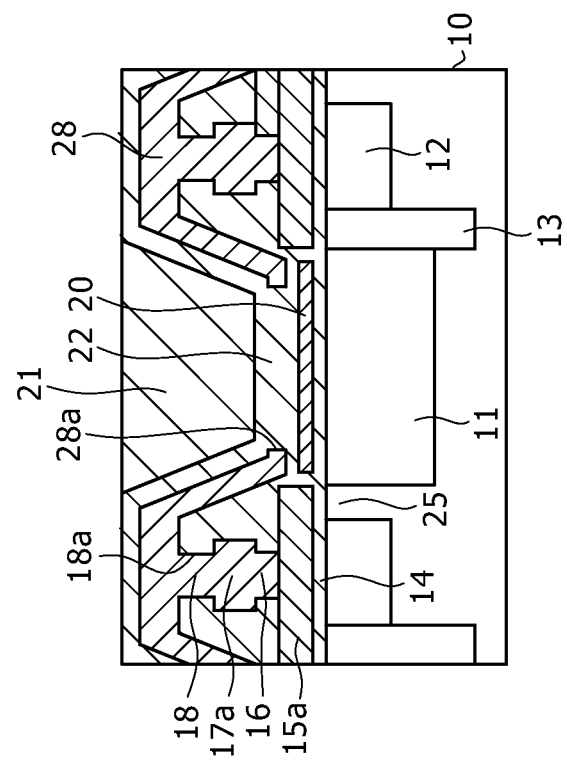

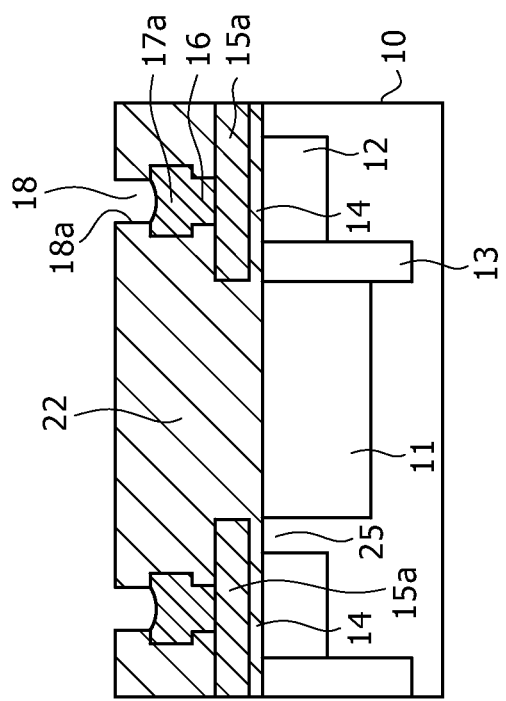
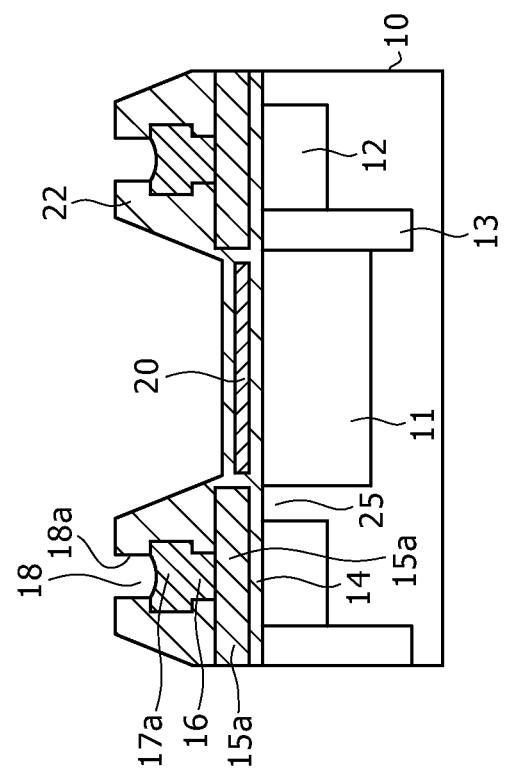

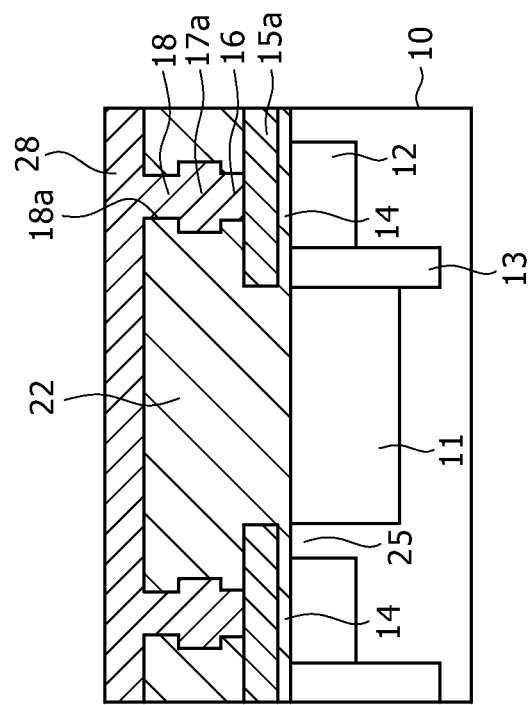
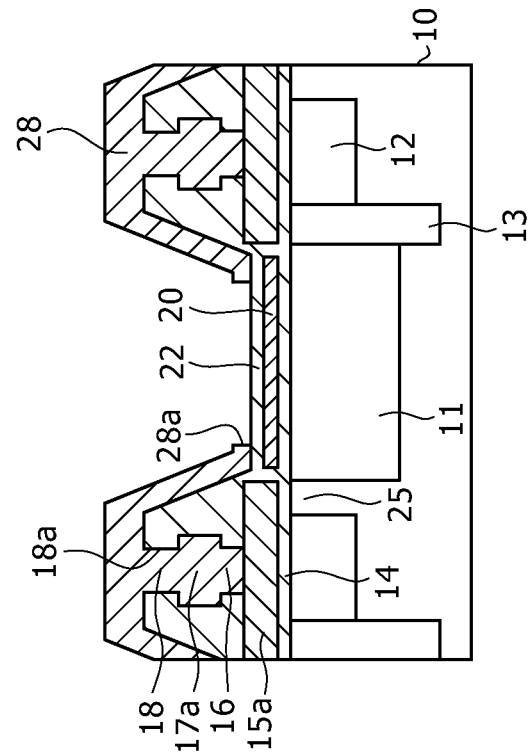

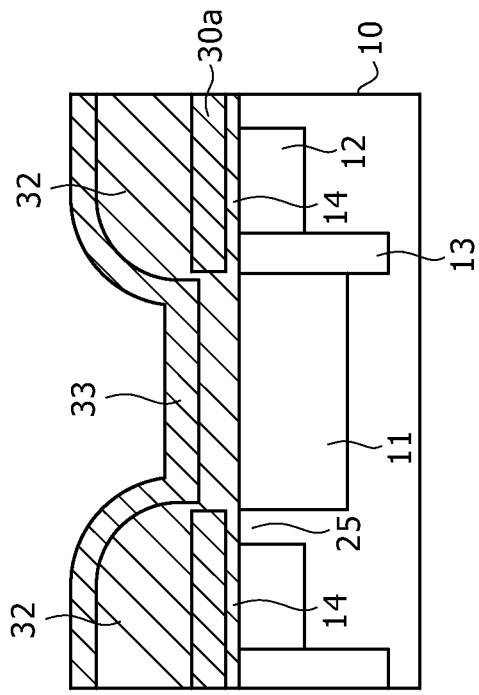
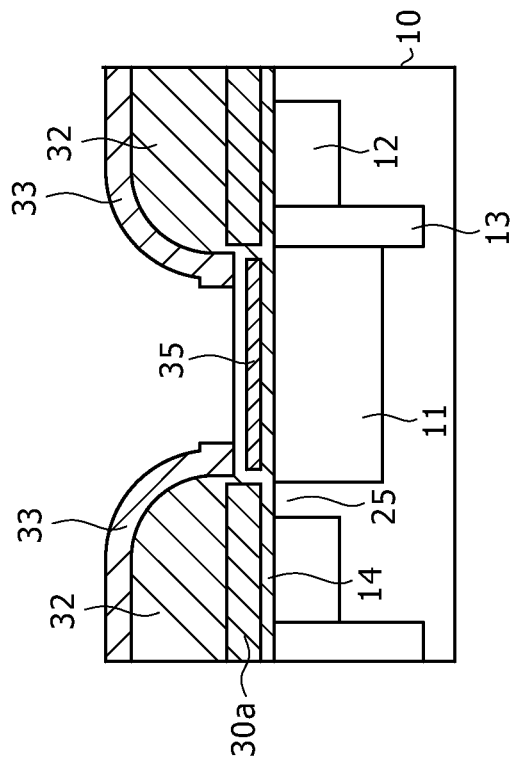

SOLID-STATE IMAGE PICKUP DEVICE, METHOD OF MANUFACTURING SOLID-STATE IMAGE PICKUP DEVICE, AND ELECTRONIC APPARATUS

BACKGROUND

The present disclosure relates to an image pickup device. In particular, the present disclosure relates to a solid-state image pickup device in which an Optical Black pixel area is light-blocked by a light blocking film, and a method of manufacturing the solid-state image pickup device. In addition, the present disclosure relates to an electronic apparatus using the solid-state image pickup device.

A Charge Coupled Device (CCD) type solid-state image pickup element used in an area sensor, a digital still camera or the like is mainly composed of plural photodiodes, vertical transfer portions, a horizontal transfer portion, and an outputting portion.

A photodiode is a photoelectric conversion portion for subjecting an incident light to photoelectric conversion. Plural photodiodes are formed on a semiconductor substrate. The vertical transfer portion is an area in which the electric charges supplied from the photodiodes are received and are then transferred. The vertical transfer portion is composed of a vertical transfer path formed above the semiconductor substrate, and plural vertical transfer electrodes disposed adjacent to one another on an upper portion of the vertical transfer path. In the vertical transfer portion, the vertical transfer electrodes are successively driven, thereby transferring the electric charges through the vertical transfer path in a vertical direction. On the other hand, the horizontal transfer portion is an area in which the electric charges supplied from the vertical transfer portion are received and are then transferred. The horizontal transfer portion is composed of a horizontal electric charge transferring portion formed above the semiconductor substrate, and plural transfer electrodes disposed adjacent to one another on an upper portion of the horizontal electric charge transferring portion. In the horizontal transfer portion, the horizontal transfer electrodes are successively driven, thereby transferring the electric charges through the horizontal electric charge transfer path in a horizontal direction. The outputting portion is formed in a final stage of the horizontal transfer portion, and converts the electric charges transferred thereto from the horizontal transfer portion into a voltage, thereby outputting the resulting voltage.

In such a CCD type solid-state image pickup element, in recent years, for the purpose of making a large field angle and high-speed rate transfer possible, it is required to reduce a resistance value of the transfer electrode. At the same time, there is caused a problem that along with an increase in the number of pixels, a light receiving area per one pixel is reduced, and a quantity of received light is reduced, thereby reducing the sensitivity. A structure including a light blocking film serving as a wiring as well for control, and connected to a vertical transfer electrode is proposed for the purpose of the reduced resistance value, the increase in the light receiving area, reduction in resistance value of a wiring layer and the like. This technique, for example, is disclosed in Japanese Patent Laid-Open Nos. 2000-81402 and 2009-252840.

In addition, in general, a pixel area of the CCD type solid-state image pickup element includes an effective pixel area and an Optical Black (OB) pixel area. In this case, the effective pixel area outputs the electric charges generated through the photoelectric conversion for the received light. The OB pixel area is used to obtain a signal which is used as a reference of the black level. In the OB pixel area, the entire light receiving areas of the pixels are covered with a light blocking film. Japanese Patent Laid-Open No. Hei 11-186204 describes a structure in which a light blocking film formed in an effective pixel area and a light blocking film formed in an OB pixel area are formed integrally with each other to be electrically connected to each other. In this case, an opening portion is formed in the light blocking film right above a photoelectric conversion portion in the effective pixel area, and the light blocking film is formed above the photoelectric conversion portion so as not to form an opening portion in the light blocking film in the OB pixel area.

SUMMARY

Although in general, the OB pixel area which outputs a value of the black level of the image pickup area is light-blocked in such a way by the light blocking film, the OB pixel area involves a factor, for reducing the optical characteristics, such as generation of a dark current. For this reason, it is desired that in the OB pixel area, the generation of the dark current is suppressed, thereby improving the optical characteristics.

The present disclosure has been made in order to solve the problems described above, and it is therefore desirable to provide a solid-state image pickup device in which generation of a dark current is suppressed in an OB pixel area, a method of manufacturing the same, and an electronic apparatus using the same.

In order to attain the desire described above, according to an embodiment of the present disclosure, there is provided a solid-state image pickup device including: a photoelectric conversion portion formed on a substrate and composed of a photodiode; an image pickup area in which plural pixels each including a reading-out electrode for reading out signal electric charges generated and accumulated in the photoelectric conversion portion are formed; and a light blocking film having an opening portion right above the photoelectric conversion portion in an effective pixel area of the image pickup area, and light-blocking the photoelectric conversion portion in an OB pixel area of the image pickup area, in which a film deposited between the light blocking film and the substrate above the photoelectric conversion portion in the OB pixel area is composed of only a silicon oxide film.

In the solid-state image pickup device according to the embodiment of the present disclosure, the film formed between the substrate and the light blocking film above the photoelectric conversion section in the OB pixel area is composed of only the silicon oxide film. As a result, when an electric potential is applied to the light blocking film, it is possible to prevent the electric charges from being charged in the layer between the light blocking film and the substrate. For this reason, there is suppressed the generation of the dark current due to the fact that the electric charges are charged in the layer between the light blocking film and the substrate in the OB pixel area.

According to another embodiment of the present disclosure, there is provided a method of manufacturing a solid-state image pickup device. The method includes: preparing a substrate including a photoelectric conversion portion generating and accumulating signal electric charges corresponding to a quantity of received light in an image pickup area composed of an effective pixel area and an OB pixel area; forming a reading-out electrode reading out the signal electric charges accumulated in the photoelectric conversion portion on the substrate through a gate insulating film; forming an insulating film formed from a silicon oxide film above the reading-out electrode; and forming an opening portion in the insulating film for exposing an upper portion of the photoelectric conversion portion in the effective pixel area upwardly in a state in which only the insulating film formed from the silicon oxide film is formed right above the photoelectric conversion portion in the OB pixel area, and forming a light blocking film light-blocking the photoelectric conversion portion in the OB pixel area.

In the method of manufacturing a solid-state image pickup device according to the embodiment of the present disclosure, the light blocking film is formed in the state in which only the insulating film formed from the silicon oxide film is formed right above the photoelectric conversion portion in the OB pixel area. Therefore, only the silicon oxide film is disposed between the light blocking film and the substrate right above the photoelectric conversion portion in the OB pixel area. As a result, when an electric potential is applied to the light blocking film, it is possible to prevent the electric charges from being charged in the layer between the light blocking film and the substrate. For this reason, there is suppressed the generation of the dark current due to the fact that the electric charges are charged in the layer between the light blocking film and the substrate in the OB pixel area.

According to a further embodiment of the present disclosure, there is provided an electronic apparatus. The electronic apparatus includes: an optical lens; a solid-state image pickup device; and a signal processing circuit. The solid-state image pickup device includes: a photoelectric conversion portion formed on a substrate and composed of a photodiode; and an image pickup area in which plural pixels each including a reading-out electrode for reading out signal electric charges generated and accumulated in the photoelectric conversion portion are formed. The solid-state image pickup device further includes: a light blocking film having an opening portion right above the photoelectric conversion portion in an effective pixel area of the image pickup area, and light-blocking the photoelectric conversion portion in an OB pixel area of the image pickup area; a film deposited between the light blocking film and the substrate being formed from only a silicon oxide film in the OB pixel area, in which a light condensed by the optical lens is made incident to the solid-state image pickup device. The signal processing circuit processes an output signal outputted from the solid-state image pickup device.

In the electronic apparatus according to the further embodiment of the present disclosure, in the solid-state image pickup device, only the silicon oxide film is disposed between the light blocking film and the substrate right above the photoelectric conversion portion in the OB pixel area. As a result, the generation of the dark current is suppressed in the OB pixel area.

As set forth hereinafter, according to the embodiments of the present disclosure, it is possible to obtain the solid-state image pickup device in which the generation of the dark current in the OB pixel area is suppressed, and the method of manufacturing the same. In addition, by using the solid-state image pickup device, the electronic apparatus is obtained in which the image quality is enhanced.

BRIEF DESCRIPTION OF THE DRAWINGS

FIGS. 5A and 5B are respectively top plan views showing a manufacturing process in the effective pixel area and the OB pixel area of the CCD type solid-state image pickup device according to the first embodiment of the present disclosure;

FIGS. 9A and 9B are respectively cross sectional views taken on lines A-A of FIGS. 8A and 8B;

FIGS. 16A and 16B are respectively cross sectional views taken on lines A-A of FIGS. 15A and 15B;

FIGS. 20A and 20B are respectively cross sectional views showing structures of an effective pixel area and an OB pixel area of a CCD type solid-state image pickup device according to a second embodiment of the present disclosure;

FIGS. 21A and 21B are respectively cross sectional views showing a manufacturing process in the effective pixel area and the OB pixel area of the CCD type solid-state image pickup device according to the second embodiment of the present disclosure;

FIGS. 22A and 22B are respectively cross sectional views showing a manufacturing process in the effective pixel area and the OB pixel area of the CCD type solid-state image pickup device according to the second embodiment of the present disclosure;

FIGS. 25A and 25B are respectively cross sectional views each taken on line A-A of FIG. 23, and showing cross sectional structures of an effective pixel area and an OB pixel area of the CCD type solid-state image pickup device according to the third embodiment of the present disclosure;

DETAILED DESCRIPTION OF THE PREFERRED EMBODIMENTS

Figure 29A:
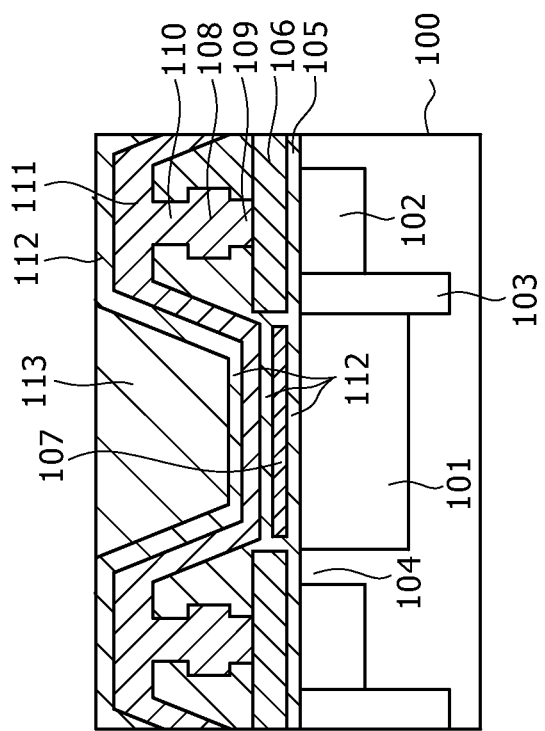
FIGS. 29A and 29B are respectively cross sectional views of an effective pixel area and an OB pixel area in a CCD type solid-state image pickup device manufactured in existing manufacturing processes.
Figure 29B:
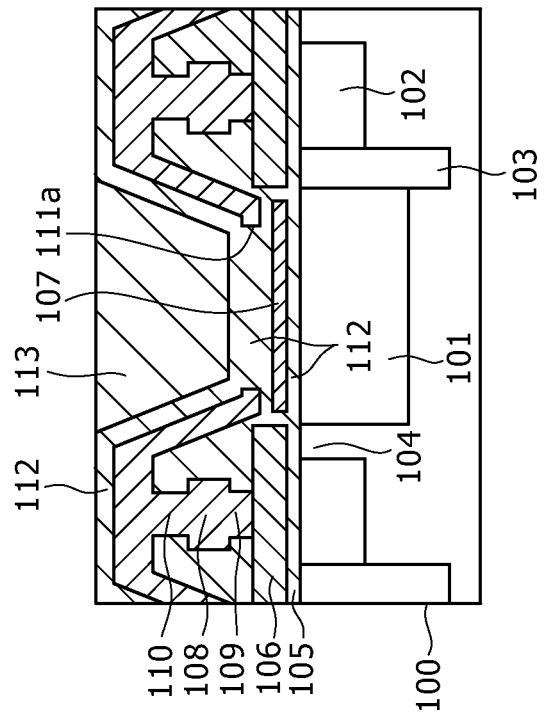

The inventors of this application firstly carried out the following examinations. FIGS. 29A and 29B are cross sectional views of a CCD type solid-state image pickup device manufactured in existing manufacturing processes. That is to say, FIGS. 29A and 29B respectively show cross sectional structures of the effective pixel area 114 and the OB pixel area 115, and also show cross section of a photoelectric conversion portion 101 and vertical transfer portions each adjacent to the photoelectric conversion portion 101. Also, FIGS. 29A and 29B show an example in which a light blocking film 111 serves as a control wiring as well for controlling a transfer electrode.

As shown in FIGS. 29A and 29B, the photoelectric conversion portion 101 composed of a photodiode, and transfer channel portions 102 are structured on a substrate 100. In this case, each of the transfer channel portions 102 transfers the electric charges received from the photoelectric conversion portion 101 in a vertical direction. In addition, a reading-out channel portion 104 is formed between the photoelectric conversion portion 101 and the transfer channel portion 102 adjacent to one side of the photoelectric conversion portion 101. Also, a channel stop portion 103 for electrically separating adjacent pixels from each other is formed in an area except for the reading-out channel portion 104 in the circumference of the photoelectric conversion portion 101. In addition, a transfer electrode 106 serving as a reading-out electrode as well is formed on an upper portion of the transfer channel portion 102 through a gate oxide film 105. Also, a nitride film becoming an anti-reflection film 107 is formed on the upper portion of the photoelectric conversion portion 101 through a silicon oxide film.

Also, a control wiring 108 is formed on an upper portion of the transfer electrode 106 through an insulating film 112 formed from a silicon oxide film. The control wiring 108 is connected to the transfer electrode 106 by a contact portion 109 formed in an insulating film 112. The light blocking film 111 is further formed on an upper portion of the control wiring 108 through an insulating film 112 formed from a silicon oxide film. In this case, the light blocking film 111 is formed so as to light-block an area other than the photoelectric conversion portion 101 in the effective pixel area 114. That is to say, an opening portion 111a formed in the light blocking film 111 is opened in the photoelectric conversion portion 101 in the effective pixel area 114, and the photoelectric conversion portion 101 is light-blocked in the OB pixel area 115.

In such a way, the CCD type solid-state image pickup device shown in FIGS. 29A and 29B is an example in which the light blocking film 111 is connected to the transfer electrode 106 through the control wiring 108, and the light blocking film 111 serves as the control wiring as well for controlling the transfer electrode 106. In such a CCD type solid-state image pickup device, a desired drive pulse is applied to the light blocking film 111, which results in that the transfer electrode 106 is driven through the control wiring 108. Also, the transfer electrode 106 is driven, whereby signal electric charges generated and accumulated in the photoelectric conversion portion 101 are transferred to the transfer channel portion 102 through the reading-out channel portion 104.

In addition, the light blocking film 111 is formed crookedly to the substrate 100 side in the area surrounding the photoelectric conversion portion 101 so as to light-block not only the upper portion of the control wiring 108, but also the side portion of the control wiring 108. As a result, since the side surfaces of the control wiring 108 and the contact portion 109 are both light-blocked, it is possible to prevent an oblique light from passing the portion between the transfer electrode 106 and the control wiring 108 to be made incident to the photoelectric conversion portion 101 of the adjacent pixel. In addition, the light blocking film 111 in the OB pixel area 115 is formed on the substrate 100 through a three layer structure composed of the insulating film 112 formed on the substrate 100, the anti-reflection film 107, and the insulating film 112. Moreover, the light blocking film 111 in the OB pixel area 115 is formed in the same process as that in the light blocking film in the effective pixel area 114 except that the opening portion 111a is not formed. For this reason, in the portion right above the photoelectric conversion portion 101 in the OB pixel area 115, a part of the light blocking film 111 is formed in a position closer to the substrate 100 than a part of the light blocking film 111 formed above the control wiring 118.

The insulating film 112 formed from the silicon oxide film is formed on an upper portion of the light blocking film 111 again. Also, an optical waveguide 113 is formed above the photodiode, and a color filter layer (not shown), an on-chip lens (not shown), and the like are formed on an upper portion of the optical waveguide 113. As has been described, in the CCD type solid-state image pickup device to which the existing manufacturing processes are applied, the manufacturing processes of the effective pixel area 114 are made the same as those of the OB pixel area 115 except for formation of the light blocking film 111. For this reason, even in the OB pixel area 115, the anti-reflection film 107 which needs not to be substantially formed is formed above the photoelectric conversion portion 101.

When the anti-reflection film 107 formed from the nitride film is formed above the photoelectric conversion portion 101 in the OB pixel area 115 as well in such a manner, an ONO three layer structure composed of a $SiO_2$ film, a SiN film, and a $SiO_2$ film is formed below the light blocking film 111. When the light blocking film 111 is used only as a light blocking film, it is unnecessary to especially change an electric potential of the light blocking film 111 and, for example, a given electric potential such as the grounding electric potential can be held. However, as with the CCD type solid-state image pickup device shown in FIGS. 29A and 29B, in the structure serving both as the wiring for supply of the electric potential to the control wiring 108 and the light blocking film 111, the electric potential of the light blocking film 111 is changed. Then, since the electric charges are charged in the ONO three layer structure formed below the light blocking film 111 by the applied voltage to the light blocking film 111 to change the electric potential, it is feared that a dark current is generated in the OB pixel area 115.

Then, the inventors of this application found out that the structure of the layer below the light blocking film 111 in the OB pixel area 115 is changed, thereby suppressing the generation of the dark current.

Hereinafter, solid-state image pickup devices and an electronic apparatus according to first to fifth embodiments of the present disclosure will be described in detail with reference to FIG. 1 to FIGS. 28A and 28B. The first to fifth embodiments will be described below in accordance with the following order. It is to be noted that the present disclosure is by no means limited thereto.

Figure 1:
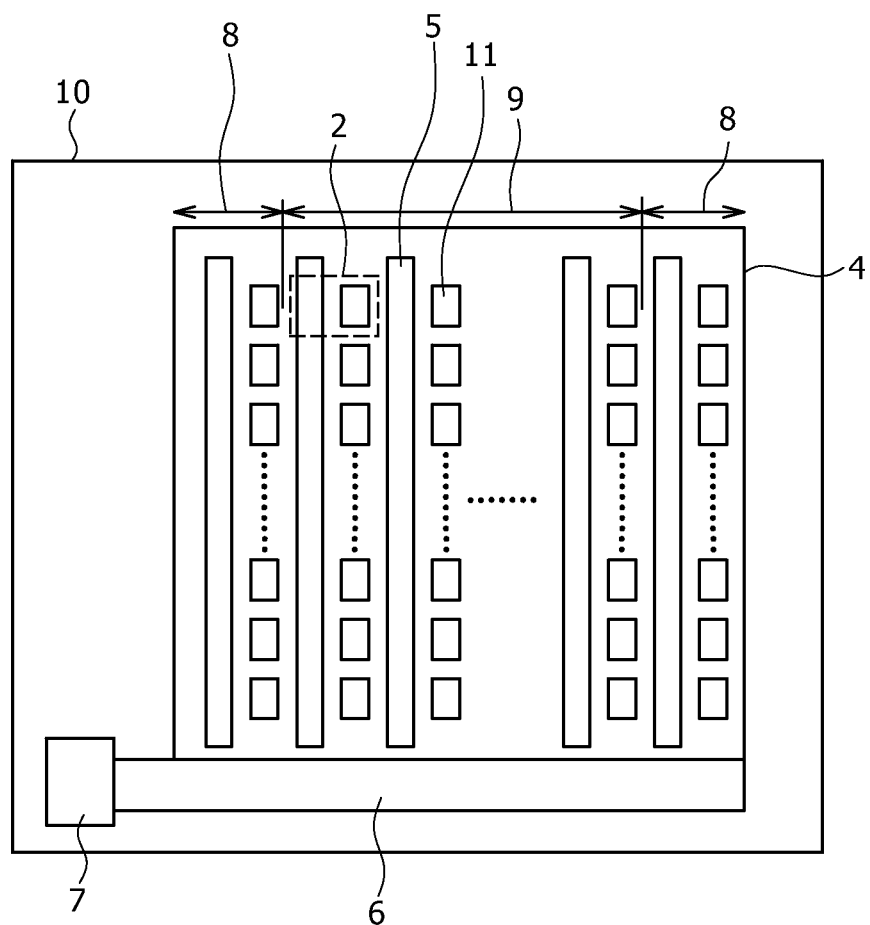
FIG. 1 is a block diagram showing an entire configuration of a CCD type solid-state image pickup device according to a first embodiment of the present disclosure.

1. First Embodiment: CCD Type Solid-State Image Pickup Device
2. Second Embodiment: CCD Type Solid-State Image Pickup Device
3. Third Embodiment: CCD Type Solid-State Image Pickup Device
4. Fourth Embodiment: CMOS Type Solid-State Image Pickup Device
5. Fifth Embodiment: Electronic Apparatus 1. First Embodiment CCD Type Solid-State Image Pickup Device 1-1 Entire Configuration FIG. 1 is a block diagram showing an entire configuration of a CCD type solid-state image pickup device according to a first embodiment of the present disclosure. As shown in FIG. 1, the CCD type solid-state image pickup device 1 of the first embodiment includes plural photoelectric conversion portions 11 formed on a substrate 10, vertical transfer portions 5, a horizontal transfer portion 6, and an outputting portion 7.

Each of the photoelectric conversion portions 11 is composed of a photodiode for generating signal electric charges corresponding to a quantity of light. In the CCD type solid-state image pickup device 1 of the first embodiment, the plural photoelectric conversion portions 11 are formed in a matrix in a horizontal direction and in a vertical direction in the substrate 10. An image pickup area 4 is structured in an area in which the plural photoelectric conversion portions 11 are formed in a matrix.

The vertical transfer portion 5 adopts a CCD structure. Also, plural vertical transfer portions 5 are formed in the vertical direction every photoelectric conversion portions 11 disposed in the vertical direction. The vertical transfer portion 5 reads out the signal electric charges accumulated in the photoelectric conversion portion 11, thereby transferring the signal electric charges in the vertical direction. A transfer stage in which the vertical transfer portions 5 in the first embodiment are formed, for example, is 4-phase driven by using a transfer drive pulse applied thereto from a transfer drive pulse circuit (not shown). In addition, in the final stage of the vertical transfer portions 5, the transfer drive pulse is applied, whereby the signal electric charges held in the final stage are transferred to the horizontal transfer portion 6.

Also, plural unit pixels 2 each composed of the photoelectric conversion portion 11 and the vertical transfer portion 5 adjacent to corresponding one of the photoelectric conversion portions 11 are disposed in the image pickup area 4. The image pickup area 4 is composed of an effective pixel area 9 and an OB pixel area 8 formed in the circumference of the effective pixel area 9. The signal electric charges which have been generated through the photoelectric conversion for a light actually received can be accumulated in the effective pixel area 9. In the OB pixel area 8, an upper portion of the photoelectric conversion portion 11 is light-blocked, and a value of optical black becoming a reference of a black level is outputted. The OB pixel areas 8, for example, are formed in both end portions of the image pickup area 4, respectively.

The horizontal transfer portion 6 adopts a CCD structure and is formed in one end of the final stage of the vertical transfer portions 5. A transfer stage in which the horizontal transfer portion 6 is formed transfers the signal electric charges which have been vertically transferred from the vertical transfer portions 5 in the horizontal direction every one horizontal line.

The outputting portion 7 subjects the signal electric charges which have been horizontally transferred thereto by the horizontal transfer portion 6 to electric charge-to-voltage conversion, thereby outputting the resulting voltage in the form of a video signal.

In the CCD type solid-state image pickup device 1 having the configuration described above, the signal electric charges accumulated in the photoelectric conversion portion 11 are transferred in the vertical direction by the vertical transfer portions 5 to be transferred to the inside of the horizontal transfer portion 6. Also, the signal electric charges transferred to the inside of the horizontal transfer portion 6 are individually transferred in the horizontal direction, and are then outputted in the form of the video signal through the outputting portion 7.

1-2 Structures of Main Portions

Figure 2A:
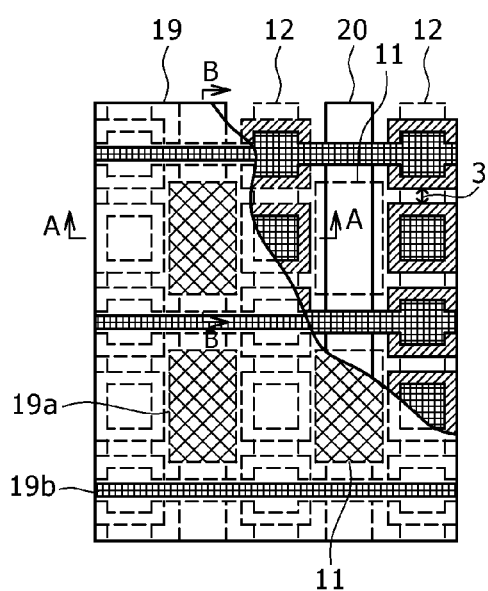
FIGS. 2A and 2B are respectively top plan views showing structures of an effective pixel area and an OB pixel area of the CCD type solid-state image pickup device according to the first embodiment of the present disclosure.
Figure 2B:
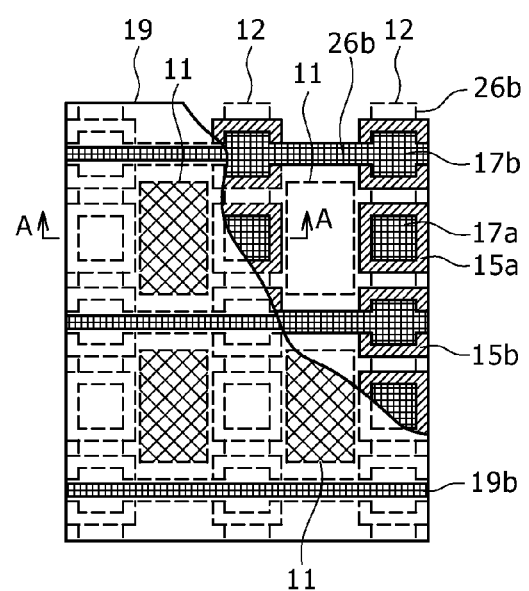
Figure 3A:
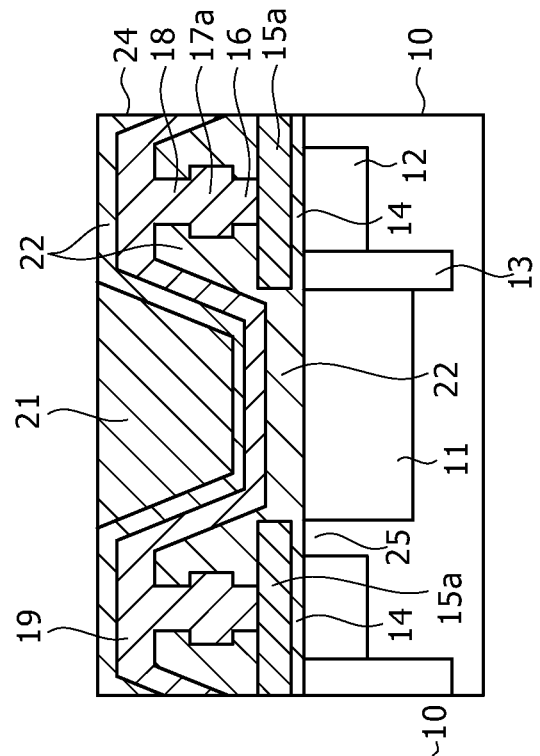
FIGS. 3A and 3B are respectively cross sectional views taken on lines A-A of FIGS. 2A and 2B.
Figure 3B:
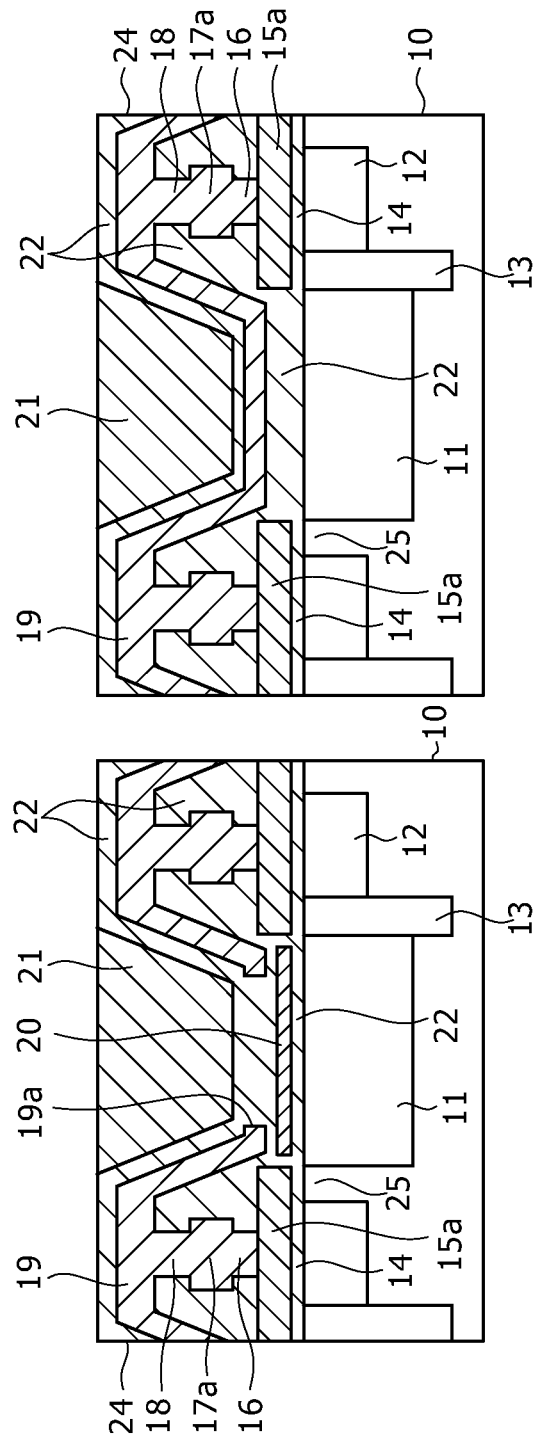
Figure 4:
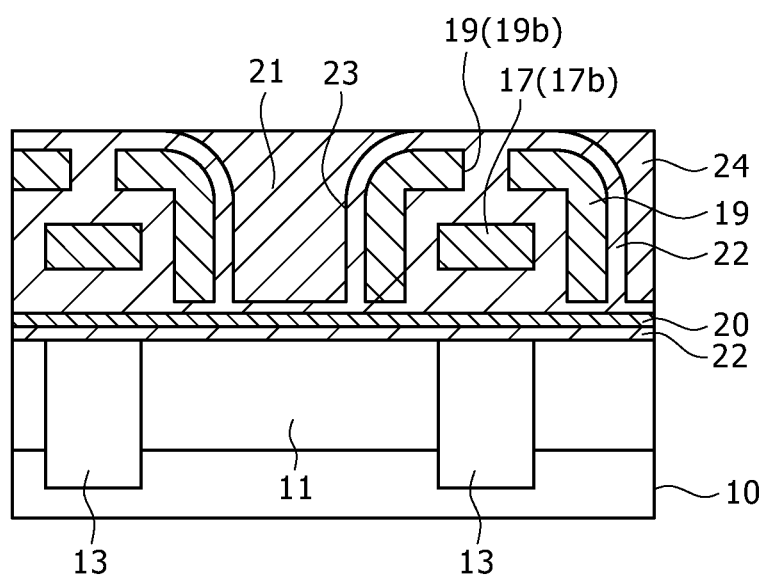
FIG. 4 is a cross sectional view taken on line B-B of FIG. 2A.

FIGS. 2A and 2B are respectively top plan views showing structures of main portions of the effective pixel area 9 and the OB pixel area 8 of the CCD type solid-state image pickup device 1 of the first embodiment. FIGS. 3A and 3B are respectively cross sectional views along the horizontal direction of the pixel in the effective pixel area 9 and the OB pixel area 8, that is, cross sectional views taken on lines A-A of FIGS. 2A and 2B. Also, FIG. 4 is a cross sectional view along the vertical direction of the pixel in the effective pixel area 9, that is, a cross sectional view taken on line B-B of FIG. 2A.

As shown in FIGS. 3A and 3B, the CCD type solid-state image pickup device 1 of the first embodiment includes a substrate 10, an anti-reflection film 20, a first transfer electrode 15a and a second transfer electrode 15b which are formed above the substrate 10. Also, the CCD type solid-state image pickup device 1 of the first embodiment also includes a wiring layer 24 and an optical waveguide 21 which are formed above the first transfer electrode 15a and the second transfer electrode 15b.

The substrate 10 is composed of a semiconductor substrate made of silicon. The photodiode composing the photoelectric conversion portion 11, a transfer channel portion 12 composing the vertical transfer portion 5, and a channel stop portion 13 becoming an isolation region for electrically isolating each adjacent two pixels 2 from each other are formed on a light incidence side of the substrate 10. The photoelectric conversion portion 11, the transfer channel portion 12, and the channel stop portion 13 are formed by implanting desired impurity ions into the substrate 10.

As shown in FIGS. 2A and 2B, the photoelectric conversion portions 11 are formed in a matrix in the vertical direction and in the horizontal direction in the substrate 10. Plural transfer channel portions 12 are formed in the vertical direction every photoelectric conversion portions 11 disposed in the vertical direction. In addition, an area between the photoelectric conversion portion 11 and the transfer channel portion 12 adjacent to one side of the photoelectric conversion portion 11 is used as a reading-out channel portion 25 for reading out the signal electric charges from the photoelectric conversion portion 11 to the transfer channel portion 12. Also, the channel stop portion 13 is an area surrounding the photoelectric conversion portion 11, and is formed in an area except for the reading-out channel portion 25. For this reason, the signal electric charges generated and accumulated in the photoelectric conversion portion 11 are read out to the transfer channel portion 12 adjacent to one side of the photoelectric conversion portion 11 through the reading-out channel portion 25.

The first transfer electrode 15a and the second transfer electrode 15b, for example, are each made of polycrystalline silicon and are formed on the transfer channel portion 12 through a gate insulating film 14 formed from a silicon oxide film. Also, the first transfer electrode 15a and the second transfer electrode 15b are separated from each other by a gap portion 3 and are formed alternately in the vertical direction. The first transfer electrode 15a is formed above the transfer channel portion 12 adjacent to a central portion of the photoelectric conversion portion 11 and is also formed in an area including the reading-out channel portion 25. The second transfer electrode 15b is formed between the first transfer electrodes 15a adjacent to each other in the vertical direction and is also formed so as to correspond to the two photoelectric conversion portions 11 adjacent to each other in the vertical direction.

The anti-reflection film 20 is formed only in the effective pixel area 9 and is also formed on the photoelectric conversion portion 11 of the effective pixel area 9 through an insulating film 22 formed from a silicon oxide film so as to extend in the vertical direction. With regard to a material composing the anti-reflection film 20, it is only necessary that the material shows an effect of the anti-reflection for the substrate 10 in a lamination structure including the silicon oxide films formed in a lower layer and an upper layer of the anti-reflection film 20, respectively. Thus, for example, a silicon nitride film can be used as the material composing the anti-reflection film 20. When the silicon nitride film is used as the anti-reflection film 20, a lamination structure composed of a silicon oxide film (refractive index: 1.46), a silicon nitride film (refractive index: 2.0), and the silicon oxide film (refractive index: 1.46) from a lower layer is obtained, thereby offering an effect of the anti-reflection.

The material composing the anti-reflection film 20 is by no means limited to the silicon nitride film, and thus a material can be applied to the anti-reflection film 20 as long as this material has a larger refractive index relative to the silicon oxide film. In addition, a material having negative fixed electric charges can be used as the material of the anti-reflection film 20. The material film having the negative fixed electric charges, for example, is formed from a hafnium oxide ($HfO_2$) film, an aluminum oxide ($Al_2O_3$) film, a zirconium oxide ($ZrO_2$) film, a tantalum oxide ($Ta_2O_5$) film, or a titanium oxide ($TiO_2$) film. A method of depositing that film, for example, includes: a chemical vapor deposition method; a sputtering method; and an atomic layer deposition method. When the atomic layer deposition method is used, preferably, a $SiO_2$ film serving to reduce interface states during the deposition is simultaneously formed so as to have a thickness of about 1 nm. Materials other than the materials described above includes: a lanthanum oxide ($La_2O_2$); a praseodymium oxide ($Pr_2O_2$), a cerium oxide ($CeO_2$); a neodymium oxide ($Nd_2O_2$); and a promethium oxide ($Pm_2O_2$). In addition, the material described above includes: a samarium oxide ($Sm_2O_2$); an europium oxide ($Eu_2O_2$); a gadolinium oxide ($Gad_2O_2$); a terbium oxide ($Tb_2O_3$); and a dysprosium oxide ($Dy_2O_3$). Moreover, the material described above includes: a holmium oxide ($Ho_2O_3$); a thulium oxide ($Tm_2O_3$); a ytterbium oxide ($Yb_2O_3$); a lutetium oxide ($Lu_2O_3$); and a yttrium oxide ($Y_2O_3$). Moreover, the film having the negative fixed electric charges described above can also be formed from a hafnium nitride film, an aluminum nitride film, a hafnium oxynitride film or an aluminum oxynitride.

Silicon (Si) or nitrogen (N) may be added to the film having the negative fixed electric charges described above in the range of not impairing the insulating property of the film. A concentration of silicon (Si) or nitrogen (N) thus added is suitably determined in the range of not impairing the insulating property of the film. Silicon (Si) or nitrogen (N) is added in such a way, thereby making it possible to enhance a heat resistance property of the film, and an ability to block the ion implantation in the process.

The wiring layer 24 is composed of the insulating film 22, the first control wiring 17a and the second control wiring 17b each formed in the insulating film 22, and the light blocking film 19. In this case, the insulating film 22 is formed from the silicon oxide film and is formed on the upper portions of the first transfer electrode 15a and the second transfer electrode 15b of the substrate 10.

The first control wiring 17a is connected to the first transfer electrode 15a through the contact portion 16 formed in the insulating film 22. Also, one first wiring 17a is formed so as to correspond to one first transfer electrode 15a.

The second control wiring 17b is composed of a control electrode portion 26a and a connection wiring 26b. In this case, the control electrode portion 26a is connected to the second transfer electrode 15b through the contact portion 16 formed in the insulating film 22. Also, the connection wiring 26b connects the control electrode portions 26a adjacent to one another in the horizontal direction. That is to say, the second control wiring 17b is formed every column of the second transfer electrode 15b.

The light blocking film 19 includes an opening portion 19a opening the photoelectric conversion portion 11 in the effective pixel area 9. Also, the light blocking film 19 is provided so as to light-block the entire surfaces of the first control wiring 17a, the second control wiring 17b, and the OB pixel area 8. In addition, the light blocking film 19 is crookedly formed on the substrate 10 side in the area surrounding the photoelectric conversion portion 11 so as to light-block not only the upper portions of the first control wiring 17a and the second control wiring 17b, but also the side portion of the layer formed on the upper portions of the first transfer electrode 15a and the second transfer electrode 15b.

In addition, the light blocking film 19 is connected to the first control wiring 17a through the contact portion 18 formed in the insulating film 22, and is separated every row by a separation portion 19b formed linearly above the upper portion of the second control wiring 17b. That is to say, the light blocking film 19 is connected commonly to the first control wirings 17a adjacent to one another in the horizontal direction. Also, the light blocking films adjacent to one another in the vertical direction are electrically separated from one another. The CCD type solid-state image pickup device 1 of the first embodiment adopts the structure in which the light blocking film 19 serves as the control wiring as well. In this case, the drive pulse which is to be applied to the first control wiring 17a is applied from the light blocking film 19 to the first control wiring 17a.

Also, in the first embodiment, the light blocking film 19 adopts a structure of covering not only the lamination structure composed of the first transfer electrode 15a and the first control wiring 17a, but also the side surface of the lamination structure composed of the second transfer electrode 15b and the second control wiring 17b. In addition, in a portion right above the photoelectric conversion portion 11 in the OB pixel area 8, the light blocking film 19 is formed in the position closer to the substrate 10 side than the position of the light blocking film 19 formed above the upper portions of the first control wiring 17a and the second control wiring 17b.

With regard to the material composing each of the first control wiring 17a, the second control wiring 17b, the contact portions 16 and 18, and the light blocking film 19 in the first embodiment, it is only necessary to use a material, having a light blocking property, such as W, Al, Ru, or an alloy material thereof. In addition, such a material is preferably a material having a small resistance value. Also, a lamination structure composed of two or more layers each made of a metallic material such as TiN or Ti may also be formed as a barrier metal film in the lower layer of each of the first control wiring 17a, the second control wiring 17b, and the light blocking layer 19 serving as the control wiring as well.

The optical waveguide 21 is formed above the photoelectric conversion portion 11 in both of the effective pixel area 9 and the OB pixel area 8. Also, in the first embodiment, although an illustration is omitted here for the sake of simplicity, an intra-layer lens is structured on the upper portion of the optical waveguide 21 as may be necessary in both of the effective pixel area 9 and the OB pixel area 8. Also, a color filter layer and an on-chip lens are formed in order on an upper portion of the intra-layer lens through a planarizing film.

As described above, in the CCD type solid-state image pickup device 1 of the first embodiment, in the OB pixel area 8, no anti-reflection film 20 is formed above the photoelectric conversion portion 11. Thus, the OB pixel area 8 adopts the structure in which only the silicon oxide film is formed in the lower layer of the light blocking film 19.

1-3 Manufacturing Method

Figure 10:
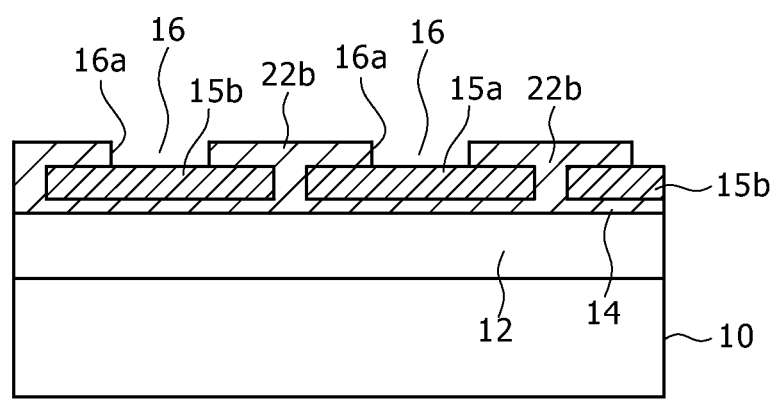
FIG. 10 is a cross sectional view taken on lines C-C of FIGS. 8A and 8B.
Figures 11A, 11B:
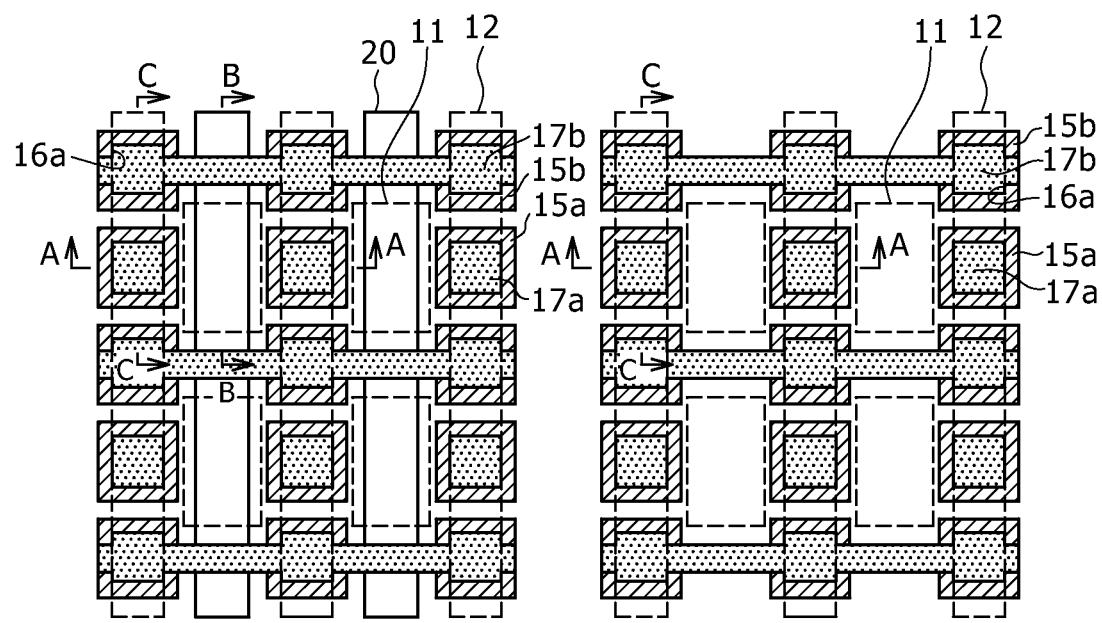
FIGS. 11A and 11B are respectively top plan views showing a manufacturing process in the effective pixel area and the OB pixel area of the CCD type solid-state image pickup device according to the first embodiment of the present disclosure.
Figure 12A:
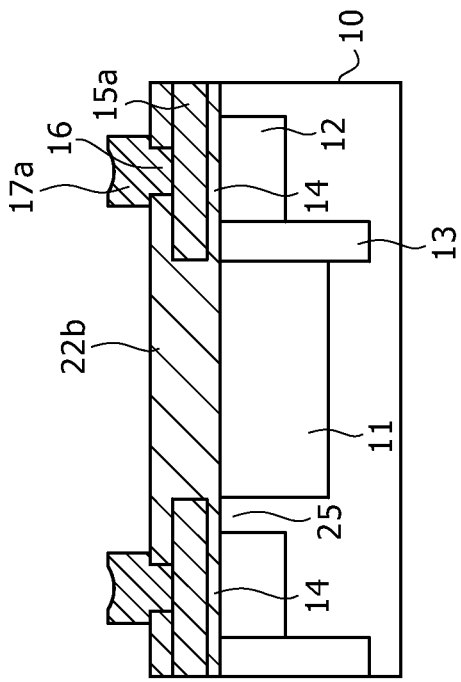
FIGS. 12A and 12B are respectively cross sectional views taken on lines A-A of FIGS. 11A and 11B.
Figure 12B:
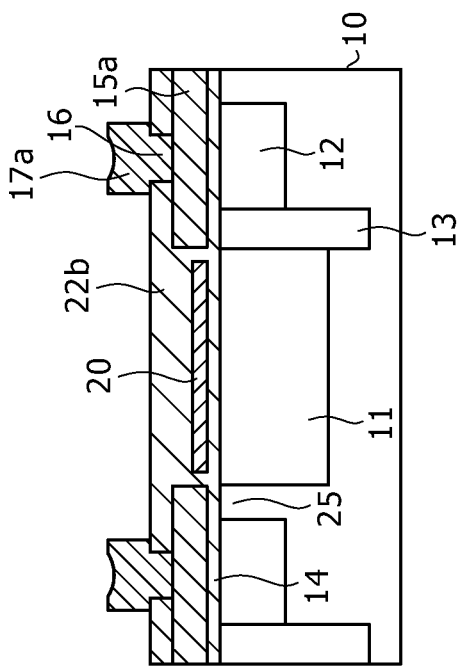
Figure 13:
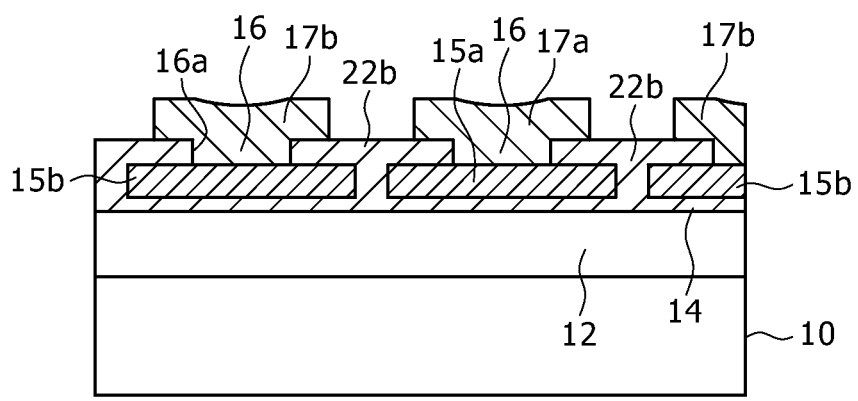
FIG. 13 is a cross sectional view taken on line C-C of FIG. 11A.
Figure 14:
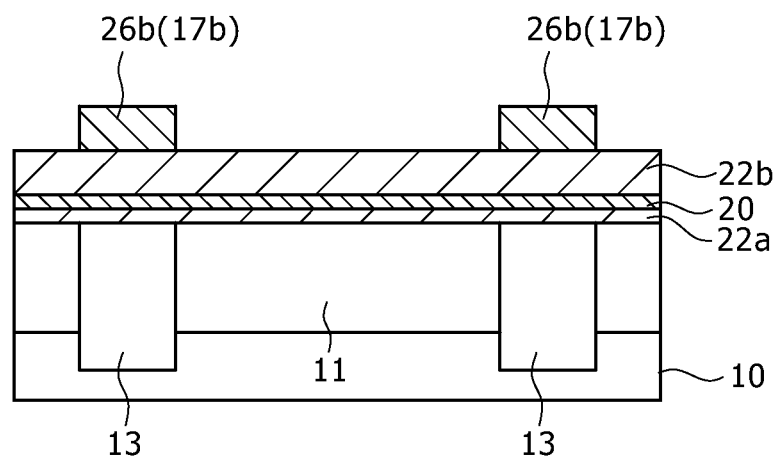
FIG. 14 is a cross sectional view taken on line B-B of FIG. 11A.
Figure 15A:
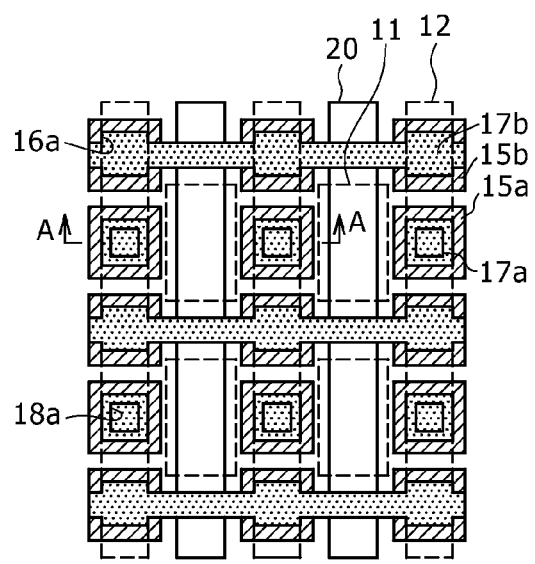
FIGS. 15A and 15B are respectively top plan views showing a manufacturing process in the effective pixel area and the OB pixel area of the CCD type solid-state image pickup device according to the first embodiment of the present disclosure.
Figure 15B:
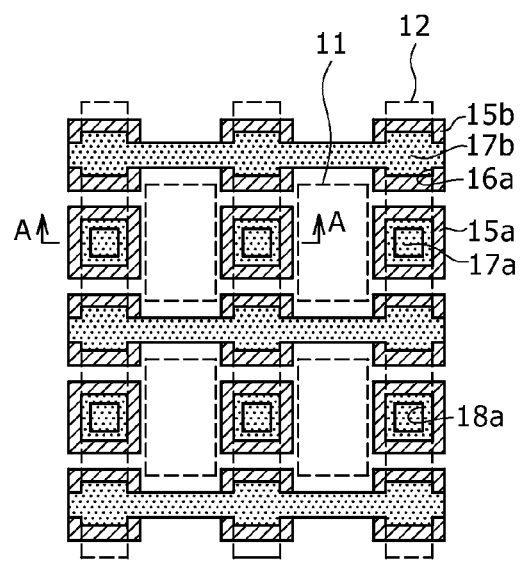
Figure 17A:
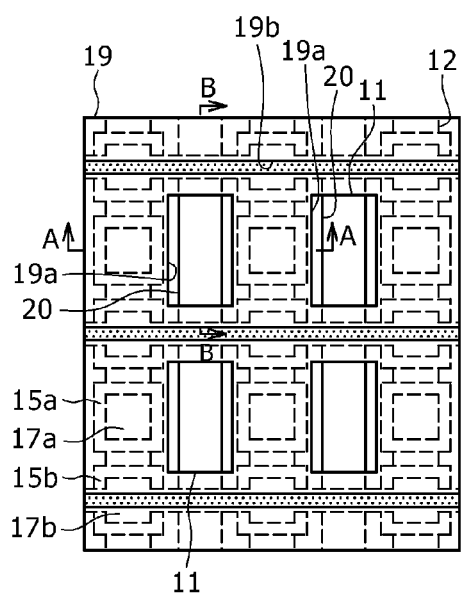
FIGS. 17A and 17B are respectively top plan views showing a manufacturing process in the effective pixel area and the OB pixel area of the CCD type solid-state image pickup device according to the first embodiment of the present disclosure.
Figure 17B:
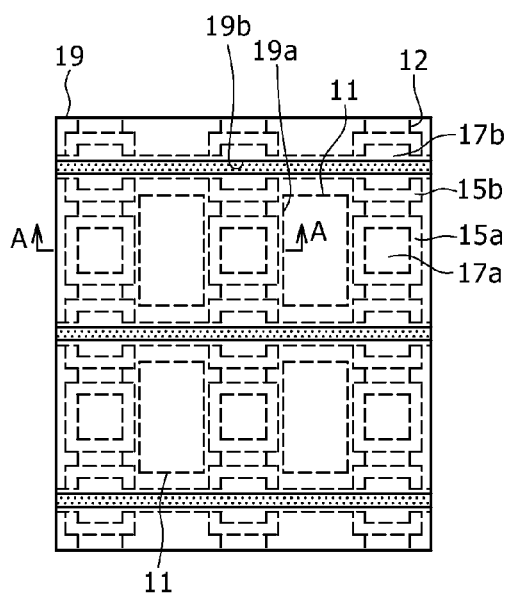
Figure 18A:
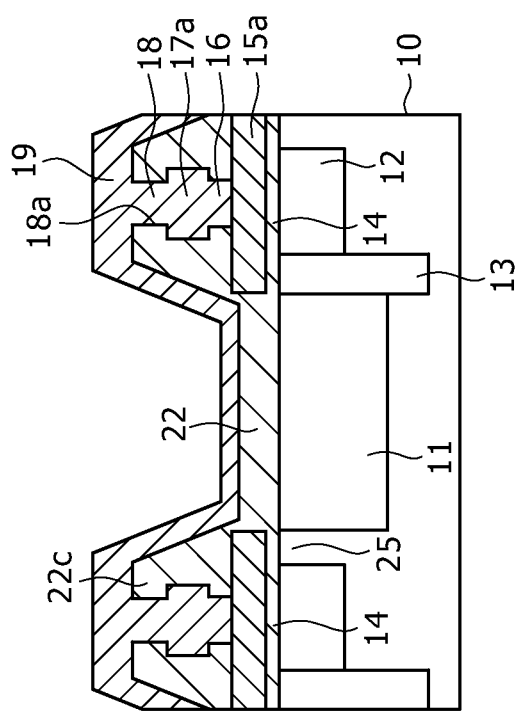
FIGS. 18A and 18B are respectively cross sectional views taken on lines A-A of FIGS. 17A and 17B.
Figure 18B:
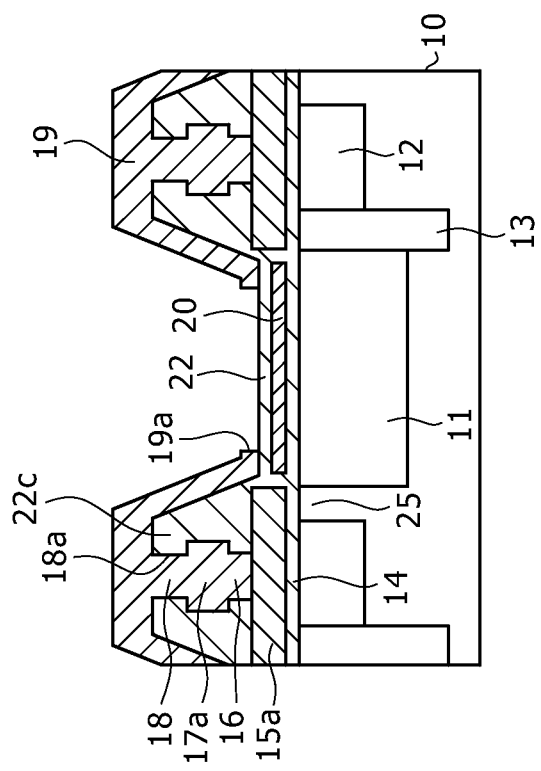
Figure 19:
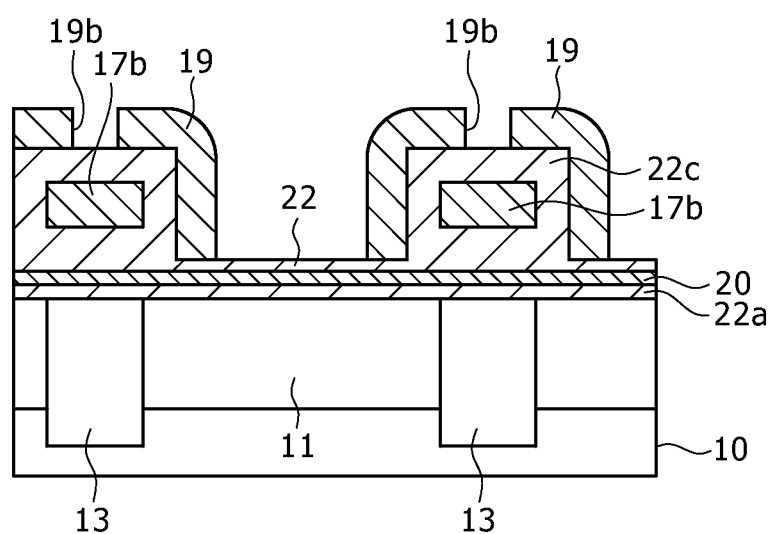
FIG. 19 is a cross sectional view taken on line B-B of FIG. 17A.

A method of manufacturing the CCD type solid-state image pickup device 1 according to the first embodiment of the present disclosure will be described in detail hereinafter with reference to FIGS. 6A and 6B to FIG. 19. FIGS. 5A and 5B, FIGS. 8A and 8B, FIGS. 11A and 11B, FIGS. 15A and 15B, and FIGS. 17A and 17B are respectively top plan views showing manufacturing processes in the effective pixel area 9 and the OB pixel area 8 of the CCD type solid-state image pickup device 1 of the first embodiment. In addition, FIGS. 6A and 6B, FIGS. 9A and 9B, FIGS. 12A and 12B, FIGS. 16A and 16B, and FIGS. 18A and 18B are respectively cross sectional views along the horizontal direction of the pixels in the effective pixel area 9 and the OB pixel area 8, and are also cross sectional views taken on lines A-A of FIGS. 5A and 5B, FIGS. 8A and 8B, FIGS. 11A and 11B, FIGS. 15A and 15B, and FIGS. 17A and 17B in the corresponding manufacturing processes. In addition, FIGS. 14 and 19 are respectively cross sectional views along the vertical direction of the area in which the photoelectric conversion portion 11 of the effective pixel area 9, and are also respectively cross sectional views taken on lines B-B of FIGS. 11A and 17A in corresponding manufacturing processes. In addition, FIGS. 10 and 13 are respectively cross sectional views along the vertical direction in the area in which the transfer channel portion 12 in both of the effective pixel area 9 and the OB pixel area 8 is formed, and are also respectively cross sectional views taken on lines C-C of FIGS. 8A and 8B, and FIGS. 11A and 11B in corresponding manufacturing processes.

In addition, in the following description, the insulating film 22 formed under the lower layer of the anti-reflection film 20 is referred to as "the insulating film 22a," and the insulating film 22 formed between the anti-reflection film 20, and the first control wiring 17a and the second control wiring 17b is referred to as "the insulating film 22b." Also, the insulating film 22 formed between the contact portion 16 and the light blocking film 19 is referred to as "the insulating film 22c." Also, when the insulating films 22a, 22b, and 22c are not distinguished from one another, the insulating films 22a, 22b, and 22c are collectively referred to as "the insulating film 22" for the sake of convenience of the description.

Firstly, as shown in FIGS. 5A and 5B, FIGS. 6A and 6B, and FIG. 7, the photoelectric conversion portion 11, the transfer channel portion 12, and the channel stop portion 13 are formed on the substrate 10, and the first transfer electrode 15a and the second transfer electrode 15b are then formed above the upper portion of the transfer channel portion 12. After that, the anti-reflection film 20 is formed.

Figure 6A:
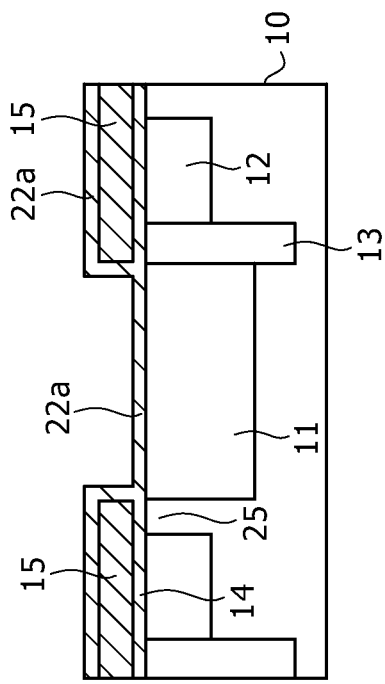
FIGS. 6A and 6B are respectively cross sectional views taken on lines A-A of FIGS. 5A and 5B.
Figure 6B:
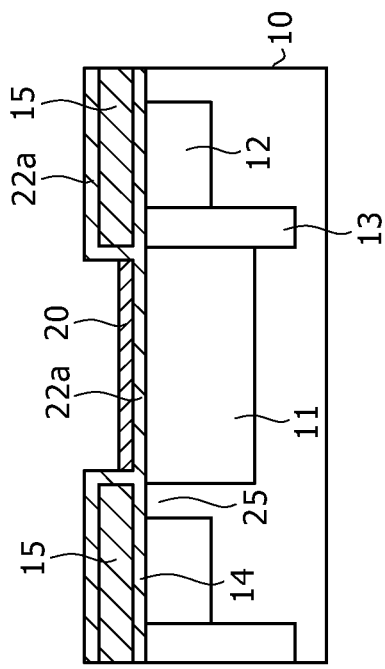

The photoelectric conversion portion 11, as shown in FIGS. 6A and 6B, is formed on the surface side becoming the light radiation surface side of the substrate 10. Also, plural photoelectric conversion portions 11 are formed in a matrix. The transfer channel portion 12 is formed between the photoelectric conversion portion 11 and the transfer channel portion 12 adjacent to one side of the photoelectric conversion portion 11. Also, plural transfer channel portions 12 are formed so as to correspond to the photoelectric conversion portions 11 for each row, respectively. In addition, the reading-out channel portion 25 is formed between the transfer channel portion 12 adjacent to one side of the photoelectric conversion portion 11, and the photoelectric conversion portion 11 concerned. The channel stop portion 13 is the area surrounding the photoelectric conversion portions 11 and is formed in the area except for the reading-out channel portion 25. The photoelectric conversion portion 11, the transfer channel portion 12, the reading-out channel portion 25, and the channel stop portion 13, for example, are formed by implanting the desired impurity ions from the front surface side of the substrate 10.

Figure 7:
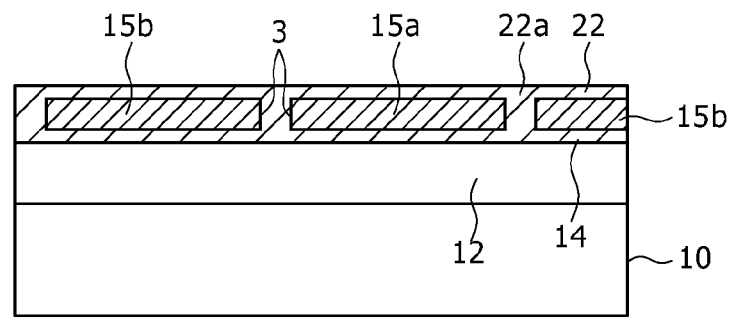
FIG. 7 is a cross sectional view taken on lines C-C of FIGS. 5A and 5B.
Figure 8A:
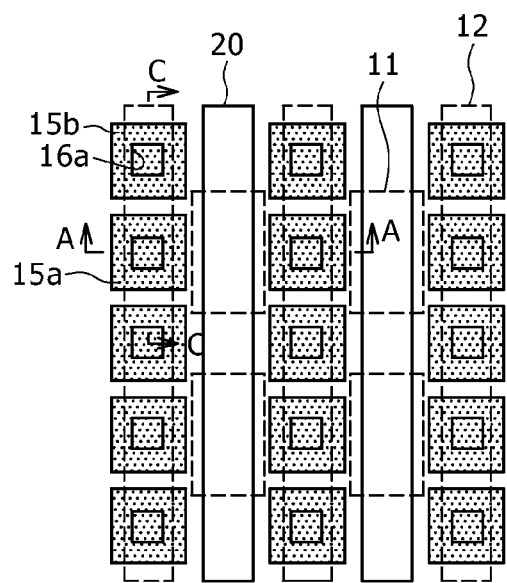
FIGS. 8A and 8B are respectively top plan views showing a manufacturing process in the effective pixel area and the OB pixel area of the CCD type solid-state image pickup device according to the first embodiment of the present disclosure.
Figure 8B:
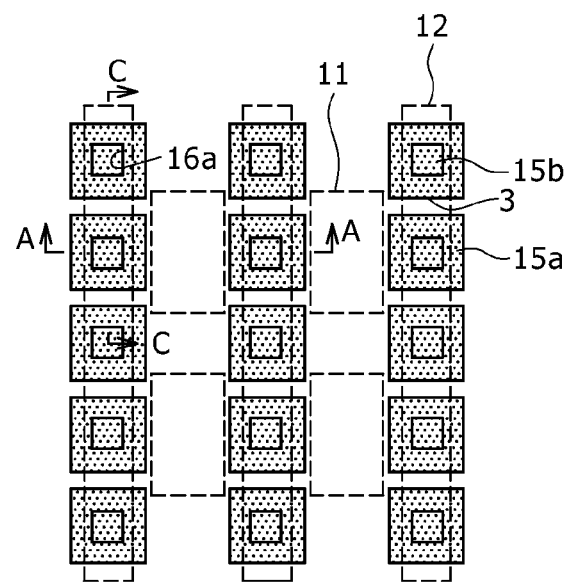

As shown in FIGS. 6A and 6B, and FIG. 7, the first transfer electrode 15a and the second transfer electrode 15b are formed on the upper portion of the transfer channel portion 12 formed on the substrate 10 through the gate insulating film 14 formed from the silicon oxide film. Also, the first transfer electrode 15a and the second transfer electrode 15b are alternately formed in the vertical direction so as to sandwich the gap portion 3 between them. The first transfer electrode 15a has a rectangular shape and is formed above the upper portion of the transfer channel portion 12 adjacent to the central area of the photoelectric conversion portion 11. In addition, since the first transfer electrode 15a serves as the reading-out electrode as well, as shown in FIGS. 6A and 6B, the first transfer electrode 15a is formed so as to extend over the upper portion of the reading-out channel portion 25.

The second transfer electrode 15b has a rectangular shape similarly to the case of the first transfer electrode 15a, and is formed in an area between each two first transfer electrodes 15a adjacent to each other in the vertical direction. An electrode layer formed either from a polycrystalline silicon film or from amorphous silicon is formed and is then patterned into a predetermined shape, thereby forming the first transfer electrode 15a and the second transfer electrode 15b. The first transfer electrode 15a and the second transfer electrode 15b can be formed by utilizing the normal photolithography method and dry etching method and thus are formed as the same layer.

After that, the insulating film 22a formed from the silicon oxide film is formed as one layer over the entire surface of the image pickup area 4 including the first transfer electrode 15a and the second transfer electrode 15b so as to be buried in a gap portion 3 between the first transfer electrode 15a and the second transfer electrode 15b.

The anti-reflection film 20 is formed right above the photoelectric conversion portion 11 in the effective pixel area 9 after completion of the formation of the insulating film 22a. In the first embodiment, as shown in FIGS. 5A and 5B, the anti-reflection film 20 is formed so as to extend in the vertical direction and is also formed every column of the pixels. For example, the silicon nitride film is formed on the entire surface of the image pickup area 4 on the insulating film 22a and is then patterned so as to be left in the portion right above the photoelectric conversion portion 11 in the effective pixel area 9, thereby forming the anti-reflection film 20. As a result, as shown in FIG. 4, the anti-reflection film 20 is formed above only the upper portion of the photoelectric conversion portion 11 in the effective pixel area 9.

Next, as shown in FIGS. 8A and 8B, FIGS. 9A and 9B, and FIG. 10, the insulating film 22b formed from the silicon oxide film is further formed on the insulating film 22a including the anti-reflection film 20, thereby forming the contact hole 16a through both of the first transfer electrode 15a and the second transfer electrode 15b are exposed. The insulating film 22b is formed so as to fill not only the anti-reflection film 20 formed in the effective pixel area 9, but also the irregularities formed on the substrate 10 through the formation of both of the first transfer electrode 15a and the second transfer electrode 15b, thereby obtaining the flat surface.

The insulating film 22b on the upper portions of both of the first transfer electrode 15a and the second transfer electrode 15b is selectively removed away by utilizing a suitable etching method, thereby forming the contact hole 16a.

Next, as shown in FIGS. 11A to 14, a conductive material is buried in the contact hole 16a, thereby forming the contact portion 16. Also, both of the first control wiring 17a and the second control wiring 17b having respective desired shapes are formed on the upper portion of the insulating film 22b so as to be connected to the contact portion 16.

After a conductive film made of a conductive material is formed over the entire surface of the insulating film 22b including the contact portion 16, the conductive film made of the conductive material is patterned into a desired shape by utilizing the photolithography method and the dry etching method, thereby forming both of the first control wiring 17a and the second control wiring 17b.

The first control wiring 17a is formed right above the first transfer electrode 15a and, for example, is also formed so as to have a rectangular shape smaller in size than the first transfer electrode 15a in the area covering the contact portion 16. In addition, the first control wiring 17a is formed every first transfer electrode 15a. As a result, the first transfer electrode 15a and the first control wiring 17a corresponding thereto are connected to each other through the contact portion 16.

The second control wiring 17b is composed of the control electrode portion 26a and the connection wiring 26b in the area covering the contact portion 16 formed right above the second transfer electrode 15b. In this case, the control electrode portion 26a, for example, is formed so as to have a rectangular shape smaller in size than the second transfer electrode 15b. Also, the connection wiring 26b connects the control electrode portions 26a adjacent to one another in the horizontal direction. That is to say, the second control wiring 17b is formed every column of the second transfer electrode 15b and is also formed to extend in the horizontal direction so as to electrically connect the second transfer electrodes 15b adjacent to one another in the horizontal direction. The connection wiring 26b in the second transfer wirings 17b adjacent to one another in the horizontal direction, as shown in FIG. 14, is formed above the upper portion of the channel stop portion 13 between the photoelectric conversion portions 11 adjacent to one another in the vertical direction. As a result, the second transfer electrode 15b and the second control wiring 17b corresponding thereto are connected to each other through the contact portion 16, and the second transfer electrodes 15b adjacent to one another in the horizontal direction are connected to one another.

Next, the insulating film 22c covering both of the first control wiring 17a and the second control wiring 17b is formed as shown in FIGS. 15 and 15B, and FIGS. 16A and 16B. In addition, the contact hole 18a and a trench portion 23 are both formed. In this case, both of the first control wiring 17a and the second control wiring 17b are exposed from the surface of the insulating film 22c through the contact hole 18a. Also, the trench portion 23 is formed in a depth direction from the surface of the insulating film 22c in the upper portion of the photoelectric conversion portion 11.

The insulating film 22 is formed from the silicon oxide film similarly to the case of the insulating film 22c formed in the lower layer and is also formed so as to cover both of the first control wiring 17a and the second control wiring 17b. After the insulating film 22c formed from the silicon oxide film is formed over the entire surfaces of both of the effective pixel area 9 and the OB pixel area 8, the etching is carried out from the surface of the insulating film 22c until both of the first control wiring 17a and the second control wiring 17b are exposed, thereby forming the contact hole 18a.

In addition, the insulating film 22 on the upper portion of the photoelectric conversion portion 11 is etched from the surface thereof, thereby forming the trench portion 23. The trench portion 23 in the effective pixel area 9 is formed to a depth not reaching the anti-reflection film 20. Also, the trench portion 23 in the OB pixel area 8 is formed to a depth not reaching the surface of the substrate 10. Referring to FIGS. 3A and 3B, the trench portion 23 in the effective pixel area 9 and the trench portion 23 in the OB pixel area 8 are formed to the same depth. In the first embodiment, a side surface of the trench 23 along the vertical direction is formed so as to have a taper-like shape whose diameter increases from the substrate 10 to the surface of the insulating film 22. It is noted that although an illustration is omitted here, a side surface of the trench portion 23 along the horizontal direction is formed so as to become a surface vertical to the surface of the substrate 10.

Next, as shown in FIGS. 17A to 19, the contact portion 18 is formed by burying the conductive material in the contact hole 18a. Also, the light blocking film 19 is formed on the insulating film 22 so as to be connected to the contact portion 18. After a conductive film made of a desired conductive material is formed on the surface of the insulating film 22 along the shape of the trench portion 23 formed in the insulating film 22, the conductive film made of the desired conductive material is patterned into a desired shape by utilizing both of the photolithography method and the dry etching method, thereby forming the light blocking film 19. In the first embodiment, the light blocking film 19 is formed so as to have both of the opening portion 19a and the separation portion 19b. In this case, the opening portion 19a is formed right above the photoelectric conversion portion 11 in the effective pixel area 9. Also, the separation portion 19b is separated every row above the upper portion of the second control wiring 17b. In addition, in the first embodiment, the opening portion 19a is formed so as to open only a bottom portion of the trench portion 23 formed above the upper portion of the photoelectric conversion portion 11 in the effective pixel area 9. In this case, the side surface of the trench portion 23 becomes a state of being covered with the light blocking film 19. For this reason, in the trench portion 23, the light blocking film 19 is provided up to a position closer to the substrate 10. In addition, in the OB pixel area 8, the upper portion of the photoelectric conversion portion 11 is not opened.

The light blocking film 19 formed every row is connected to the first transfer electrode 15a through the first control wiring 17a. As a result, the first transfer electrodes 15a adjacent to one another in the horizontal direction are electrically connected to one another. The light blocking film 19 serves as the control wiring as well, and the drive pulse used to drive the first transfer electrode 15a is supplied from the light blocking film 19 through the first control wiring 17a. In addition, in the first embodiment, the trench portion 23 is formed in the insulating film 22 right above the photoelectric conversion portion 11, and the light blocking film 19 is formed along the trench portion 23. For this reason, the light blocking film 19 can be formed in the portion closer to the photoelectric conversion portion 11, and thus the light blocking property can be enhanced in both of the effective pixel area 9 and the OB pixel area 8.

Next, as shown in FIGS. 2A to 4, after the insulating film 22 formed from the silicon oxide film is deposited over the entire surface including the upper portion of the light blocking film 19, the optical waveguide 21 is formed in the trench 23 right above the photoelectric conversion portion 11. A material having a higher refractive index than that of a silicon oxide ($SiO_2$) (refractive index: 1.45) or the like as the formation material of the insulating film 22, for example, is used as a formation material of the optical waveguide 21. For example, a siloxane series resin, a polyimide series resin or the like can be used as the formation material of the optical waveguide 21. In addition, particles of a metallic oxide such as a titanium oxide, a tantalum oxide, a niobium oxide, a tungsten oxide, a zirconium oxide, a zinc oxide, an indium oxide, or a hafnium oxide may be contained as the formation material of the optical waveguide 21 in the resin material described above. In this case, the refractive index of the optical waveguide can be made larger.

After that, similarly to the case of the method of manufacturing the normal CCD type solid-state image pickup device, the intra-layer lens, the planarizing film, and the like are formed on the upper portion of the optical waveguide 21. Also, color filter layers and on-chip lenses corresponding to the photoelectric conversion portions 11, respectively, are formed in order, thereby completing the CCD type solid-state image pickup device 1 of the first embodiment.

In the CCD type solid-state image pickup device 1 of the first embodiment, in the effective pixel area 9, the light passing through the optical waveguide 21 to be made incident to the substrate is subjected to the photoelectric conversion in the photoelectric conversion portion 11. As a result, the signal electric charges corresponding to a quantity of light are generated and accumulated in the photoelectric conversion portion 11. Also, the desired drive pulse is applied to the light blocking film 19 serving as the control wiring as well, whereby the desired drive pulse is supplied to the first transfer electrode 15a through the first control wiring 17a. As a result, the signal electric charges accumulated in the photoelectric conversion portion 11 are read out to the transfer channel portion 12 through the reading-out channel portion 25. Both of the first transfer electrode 15a and the second transfer electrode 15b are driven every row, whereby the signal electric charges in the transfer channel portion 12 are transferred in the vertical direction.

On the other hand, in the OB pixel area 8, the upper portion of the photoelectric conversion portion 11 is light-blocked by the light blocking film 19, and thus the value of the black level is outputted from the photoelectric conversion portion 11 in the OB pixel area 8.

In the CCD type solid-state image pickup device 1 of the first embodiment, no ant-reflection film 20 is formed right above the photoelectric conversion portion 11 in the OB pixel area 8. For this reason, only the silicon oxide film composing the insulating film 22 in each of the layers is disposed in the portion between the substrate 10 and the light blocking film 19 right above the photoelectric conversion portion 11 in the OB pixel area 8. As a result, it is possible to prevent the electric charges from being charged in the insulating film 22 between the substrate 10 and the light blocking film 19 due to the change in electric potential of the light blocking film 19 serving as the control wiring as well. Also, it is possible to suppress the dark current.

In addition, in the CCD type solid-state image pickup device 1 of the first embodiment, it, for example, is unnecessary to carry out the addition of a special process to the OB pixel area 8. Thus, the OB pixel area 8 can be formed in the normal process. For this reason, it is possible to use the same processes as those in the related art. Therefore, the suppression of generation of the dark current in the OB pixel area 8 can be realized without exerting an influence on the effective pixel area 9.

As described above, in the first embodiment, in the CCD type solid-state image pickup device 1 having the light blocking film 19 serving as the control wiring as well, and including the anti-reflection film 20 right above the photoelectric conversion portion 11 in the effective pixel area 9, it is possible to suppress the generation of the dark current in the OB pixel area 8.

Although in the first embodiment, the case where the anti-reflection film 20 is formed every column above the photoelectric conversion portion 11 in the effective pixel area 9 has been described, the present disclosure is by no means limited thereto. That is to say, various kinds of changes can be made as long as a structure is adopted in which no anti-reflection film 20 is formed above the photoelectric conversion portion 11 in the OB pixel area 8. For example, the anti-reflection film 20 may also be formed so as to be left over the entire surface of the effective pixel area 9. Alternatively, the anti-reflection films 20 may also be individually formed above the photoelectric conversion portions 11, respectively, in the effective pixel area 9.

2. Second Embodiment

CCD Type Solid-State Image Pickup Device

Next, a CCD type solid-state image pickup device according to a second embodiment of the present disclosure will be described in detail. Since the planar structure of the CCD type solid-state image pickup device of the second embodiment is the same as that of the CCD type solid-state image pickup device of the first embodiment, an illustration thereof is omitted here for the sake of simplicity. FIGS. 20A and 20B are respectively cross sectional views showing structures of the effective pixel area 9 and the OB pixel area 8 in the CCD type solid-state image pickup device of the second embodiment. FIGS. 20A and 20B correspond to cross sections taken on lines A-A of FIGS. 2A and 2B, respectively. In FIGS. 20A and 20B, portions corresponding to those shown in FIGS. 3A and 3B are designated by the same reference numerals or symbols, respectively, and a repeated description thereof is omitted here for the sake of simplicity.

In the CCD type solid-state image pickup device of the second embodiment, unlike the first embodiment in structure of a light blocking film 28 in the OB pixel area 8, with regard to the light blocking film 28 in the OB pixel area 8 right above the photoelectric conversion portion 11 is formed in the same layer as that of the light blocking film 28 above each of the upper portions of the first control wiring 17a and the second control wiring 17b. That is to say, a distance between the light blocking film 28 above the photoelectric conversion portion 11 in the OB pixel area 8, and the surface of the substrate 10 is larger than that in the case of the first embodiment. Also, in the second embodiment as well, no anti-reflection film 20 is formed between the light blocking film 28 and the substrate 10 in the OB pixel area 8, but only the silicon oxide film is formed between them.

A method of manufacturing the CCD type solid-state image pickup device of the second embodiment will be described in detail hereinafter with reference to FIGS. 21A to 22B.

Processes up to a process for forming both of the first control wiring 17a and the second control wiring 17b are the same as those shown in FIGS. 5A to 14 in the first embodiment. After both of the first control wiring 17a and the second control wiring 17b are formed, as shown in FIGS. 21A and 21B, an insulating film 22c covering both of the first control wiring 17a and the second control wiring 17b is formed. In addition, a contact hole 18a and the trench portion 23 are both formed. In this case, both of the first control wiring 17a and the second control wiring 17b are exposed from a surface of the insulating film 22c through the contact hole 18a. Also, the trench portion 23 is formed in the depth direction from the surface of the insulating film 22 in the upper portion of the photoelectric conversion portion 11 in the effective pixel area 9.

The insulating film 22c is formed from the silicon oxide film similarly to the case of the insulating film 22b formed in the lower layer and is also formed so as to cover both of the first control wiring 17a and the second control wiring 17b. After the insulating film 22c from the silicon oxide film is formed over the entire surfaces of both of the effective pixel area 9 and the OB pixel area 8, the insulating film 22c is selectively etched away until both of the first control wiring 17a and the second control wiring 17b are exposed from the surface of the insulating film 22, thereby forming the contact hole 18a.

In addition, the insulating film 22 on the upper portion of the photoelectric conversion portion 11 in the effective pixel area 9 is selectively etched away from the surface thereof, thereby forming the trench portion 23. The trench portion 23 in the effective pixel area 9 is formed to the depth not reaching the anti-reflection film 20. In the second embodiment as well, the side surface of the trench 23 along the vertical direction is formed so as to have the taper-like shape whose diameter increases from the substrate 10 to the surface of the insulating film 22. It is noted that although an illustration is omitted here, the side surface of the trench portion 23 in the horizontal direction is formed so as to become the surface vertical to the surface of the substrate 10. Also, in the second embodiment, no trench portion is formed in the photoelectric conversion portion 11 in the OB pixel area 8.

Next, as shown in FIGS. 22A and 22B, the contact portion 18 is formed by burying the conductive material in the contact hole 18a. Also, the light blocking film 28 is formed on the insulating film 22 so as to be connected to the contact portion 18. After the conductive film made of a desired conductive material is formed on the surface of the insulating film 22, the conductive film made of the desired conductive material is patterned into a desired shape by utilizing the photolithography method and the dry etching method, thereby forming the light blocking film 28. In the second embodiment, the light blocking film 28 is formed so as to have the opening portion 28a and the separation portion (not shown). In this case, the opening portion 28a is formed right above the photoelectric conversion portion 11 in the effective pixel area 9. Also, the separation portion is separated every row in the upper portion of the second control wiring 17b.

In addition, in the second embodiment, the opening portion 28a is formed so as to open only the bottom portion of the trench portion 23 formed above the upper portion of the photoelectric conversion portion 11 in the effective pixel area 9. In this case, the side surface of the trench portion 23 becomes the state of being covered with the light blocking film 28. For this reason, in the trench portion 23, the light blocking film 28 is provided up to the position closer to the substrate 10. In addition, since in the portion above the upper portion of the photoelectric conversion portion 11 in the OB pixel area 8, no trench portion 23 is formed in the lower layer of the light blocking film 28, the light blocking film 28 is formed in a position higher in height than that of the light blocking film 28 surrounding the photoelectric conversion portion 11 in the effective pixel area 9. As a result, a distance between the light blocking film 28 above the photoelectric conversion portion 11 in the OB pixel area 8 and the substrate 10 is made larger than that in the case of the first embodiment. For this reason, the lower layer of the light blocking film 28 becomes hard to receive an influence of the electric potential of the light blocking film 28 formed above the photoelectric conversion portion 11 in the OB pixel area 8.

Next, as shown in FIGS. 20A and 20B, after the insulating film 22 formed from the silicon oxide film is deposited over the entire surface including the upper portion of the light blocking film 28, the optical waveguide 21 is formed in the trench 23 right above the photoelectric conversion portion 11 in the effective pixel area 9. A material having a higher refractive index than that of a silicon oxide ($SiO_2$) (refractive index: 1.45) or the like as the formation material of the insulating film 22, for example, is used as a formation material of the optical waveguide 21. For example, a siloxane series resin, a polyimide series resin or the like can be used as the formation material of the optical waveguide 21. In addition, particles of a metallic oxide such as a titanium oxide, a tantalum oxide, a niobium oxide, a tungsten oxide, a zirconium oxide, a zinc oxide, an indium oxide, or a hafnium oxide may be contained as the formation material of the optical waveguide 21 in the resin material described above. In this case, the refractive index of the optical waveguide can be made larger.

After that, similarly to the case of the method of manufacturing the normal CCD type solid-state image pickup device, the intra-layer lens, the planarizing film, and the like are formed on the upper portion of the optical waveguide 21. Also, color filter layers and on-chip lenses corresponding to the photoelectric conversion portion 11, respectively, are formed in order, thereby completing the CCD type solid-state image pickup device of the second embodiment.

Since in the CCD type solid-state image pickup device of the second embodiment, no trench portion is formed in the insulating film 22 in the OB pixel area 8, a distance between the light blocking film 28 and the substrate 10 becomes large as compared with the case of the first embodiment. Since the distance between the light blocking film 28 and the substrate 10 becomes large in such a way, the influence of the drive pulse applied to the light blocking film 28 can also be further improved as compared with the case of the first embodiment. Moreover, in the second embodiment as well, in the OB pixel area 8, the layer between the light blocking film 28 and the substrate 10 is composed of only the silicon oxide film. For this reason, the electric charges are prevented from being charged in the layer between the light blocking film 28 and the substrate 10. As a result, it is possible to prevent the electric potential of the substrate 10 from being changed, and thus it is possible to suppress the generation of the dark current.

In the method as well of manufacturing the CCD type solid-state image pickup device of the second embodiment, since it is unnecessary to add any of new processes to the OB pixel area 8, it is possible to realize the process integration. Also, it is possible to use the same processes as those in the related art. Therefore, the suppression of generation of the dark current in the OB pixel area 8 can be realized without exerting an influence on the effective pixel area 9.

3. Third Embodiment

CCD Type Solid-State Image Pickup Device

Next, a CCD type solid-state image pickup device according to a third embodiment of the present disclosure will be described in detail with reference to FIGS. 23 to 25B. Since the entire configuration of the CCD type solid-state image pickup device of the third embodiment is the same as that of the CCD type solid-state image pickup device 1 of the first embodiment shown in FIG. 1, an illustration thereof is omitted here for the sake of simplicity. In addition, in FIGS. 23 to 25B, portions corresponding to those shown in FIGS. 2A and 2B to FIG. 4 are designated by the same reference numerals or symbols, respectively, and a repeated description thereof is omitted here for the sake of simplicity.

Figure 23:
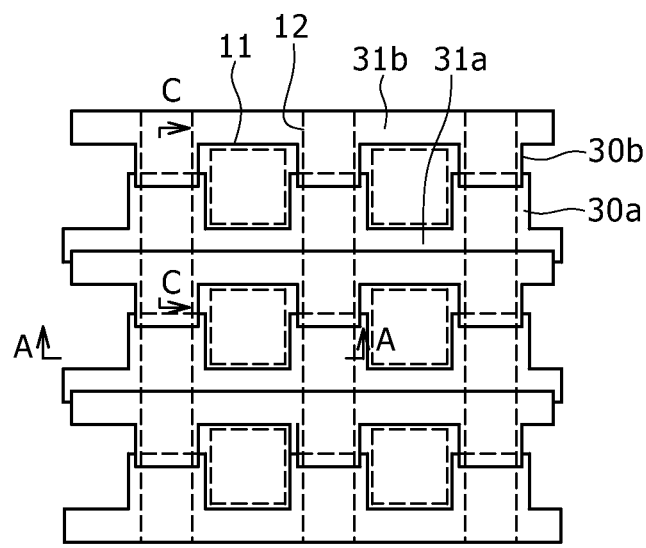
FIG. 23 is a top plan view showing a structure of a transfer electrode of a CCD type solid-state image pickup device according to a third embodiment of the present disclosure.
Figure 24:
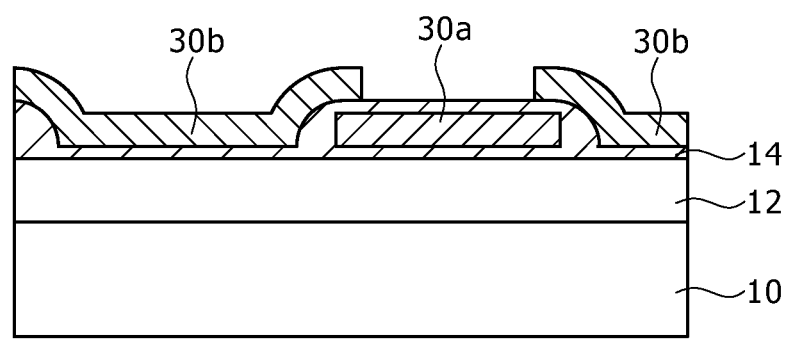
FIG. 24 is a cross sectional view taken on line C-C of FIG. 23.

FIG. 23 is a top plan view showing structures of only a first transfer electrode 30a and a second transfer electrode 30b composing the vertical transfer portion 5 shown in FIG. 1. In addition, FIG. 24 is a cross sectional view taken on line C-C of FIG. 23, and FIGS. 25A and 25B are respectively cross sectional views each taken on line A-A of FIG. 23. It is noted that FIGS. 25A and 25B respectively show a cross section corresponding to the effective pixel area 9 and a cross section corresponding to the OB pixel area 8, and also show a state in which up to a light blocking film 33 is formed.

As shown in FIG. 24, in the CCD type solid-state image pickup device of the third substrate, each of the first transfer electrode 30a and the second transfer electrode 30b is formed on the upper portion of the transfer channel portion 12 through the gate insulating film 14 formed from the silicon oxide film. Also, the first transfer electrode 30a and the second transfer electrode 30b are alternatively formed in the vertical direction. The first transfer electrode 30a adopts the structure of serving as the reading-out electrode as well, and is formed above both of the transfer channel portion 12 and the reading-out channel portion 25. The first transfer electrodes 30a and the second transfer electrodes 30b are connected every row through the connection wirings 31a and 31b, respectively. Also, each of the connection wirings 31a and 31b is formed above the channel stop 13 between the photoelectric conversion portions 11 adjacent to one another in the vertical direction. In addition, as shown in FIG. 24, the first transfer electrode 30a and the second transfer electrode 30b in the third embodiment are formed so as to partially overlap each other through the insulating film 32 in the vertical direction.

In such a CCD type solid-state image pickup device, the desired drive pulses are applied to the first transfer electrode 30a and the second transfer electrode 30b, respectively, whereby the signal electric charges accumulated in the photoelectric conversion portion 11 are read out to the transfer channel portion 12 and are then transferred within the transfer channel portion 12 in the vertical direction.

In addition, as shown in FIGS. 25A and 25B, the light blocking film 33 is formed on the upper portions of both of the first transfer electrode 30a and the second transfer electrode 30b through the insulating film 32 and is also formed so as to open only a portion right above the photoelectric conversion portion 11 in the effective pixel area 9.

In addition, in the third embodiment as well, similarly to the case of the first embodiment, the anti-reflection film 35 is formed only right above the photoelectric conversion portion 11 in the effective pixel area 9. As a result, in the OB pixel area 8, only the insulating film 32 formed from the silicon oxide film is structured between the light blocking film 33 above the photoelectric conversion portion 11, and the substrate 10.

With regard to a method of manufacturing the CCD type solid-state image pickup device of the third embodiment, firstly, after the gate insulating film 14 formed from the silicon oxide film is formed on the substrate 10, the first transfer electrode 30a is formed. After that, after the insulating film 32 formed from the silicon oxide film is formed over the entire surface covering the first transfer electrode 30a, the second transfer electrode 30b is formed. Also, after the insulating film 32 formed from the silicon oxide film is formed over the entire surface covering the second transfer electrode 30b, the anti-reflection film 35 is formed only right above the photoelectric conversion portion 11 in the effective pixel area 9. Next, the insulating film 32 formed from the silicon oxide film is further formed over the entire surface and the trench portion 32a is then formed above the upper portion of the photoelectric conversion portion 11. Also, the light blocking film 33 having the opening portion 33a opening the portion above the upper portion of the photoelectric conversion portion 11 in the effective pixel area 9 is formed on the upper portion of the insulating film 32 having the trench portion 32a formed therein. After that, although an illustration is omitted here for the sake of simplicity, the intra-optical waveguide lens, the planarizing film, the color filter layer, and the on-chip lens are formed by utilizing the same method as that in the related art, thereby completing the CCD type solid-state image pickup device of the third embodiment.

In the CCD type solid-state image pickup device of the third embodiment, the light blocking film 33 does not compose the control wiring. However, with such a structure as well, the structure is adopted such that the layer between the light blocking film 33 and the substrate 10 is composed of only the silicon oxide film in the OB pixel area 8, thereby making it possible to suppress the generation of the dark current in the OB pixel area.

Although in each of the first to third embodiments described above, the CCD type solid-state image pickup device has been described as the exemplification, the present disclosure is by no means limited thereto. Hereinafter, a CMOS type solid-state image pickup device will be described as an exemplification.

4. Fourth Embodiment

CMOS Type Solid-State Image Pickup Device

4-1 Entire Configuration

Figure 26:
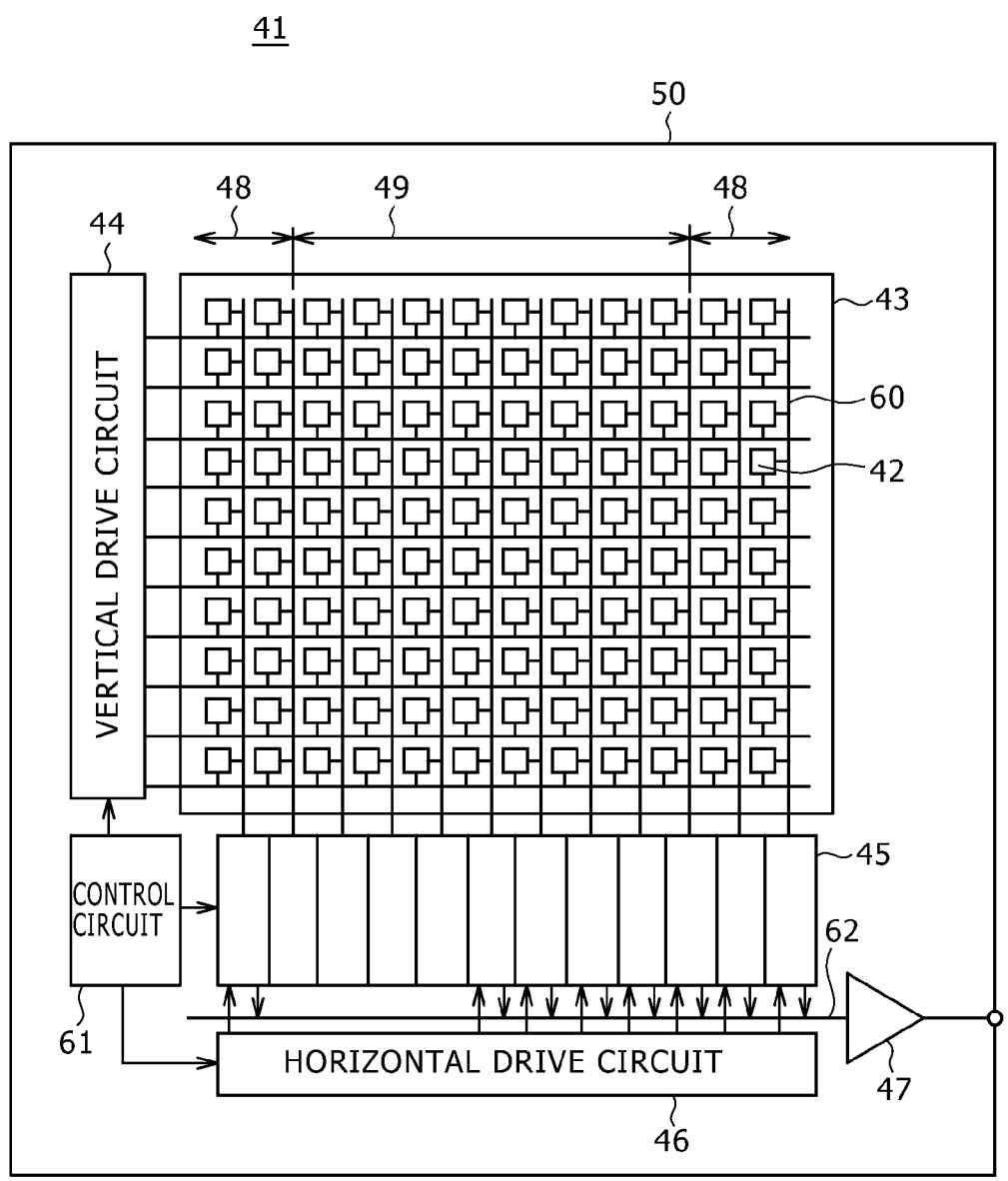
FIG. 26 is a block diagram, partly in circuit, showing an entire configuration of a CMOS type solid-state image pickup device according to a fourth embodiment of the present disclosure.

A CMOS type solid-state image pickup device according to a fourth embodiment of the present disclosure will be described in detail hereinafter with reference to FIG. 26, and FIGS. 27A and 27B. Firstly, prior to a description of structures of main portions, a description will now be given with respect to an entire configuration of the CMOS type solid-state image pickup device of the fourth embodiment. FIG. 26 is a schematic block diagram, partly in circuit, showing the entire configuration of the CMOS type solid-state image pickup device 41 of the fourth embodiment.

As shown in FIG. 26, the CMOS type solid-state image pickup device 41 of the fourth embodiment includes an image pickup area 43 composed of plural pixels 42, a vertical drive circuit 44, a column signal processing circuit 45, a horizontal drive circuit 46, an outputting circuit 47, a control circuit 61, and the like which are all provided on a substrate 50 made of silicon.

A pixel 2 is composed of a photoelectric conversion portion composed of a photodiode for generating signal electric charges in correspondence to a quantity of received light, and plural MOS transistors for reading out and transferring the signal electric charges. Also, plural pixels 2 are regularly disposed in a two-dimensional array on the substrate 50.

The image pickup area 43 is composed of the plural pixels 2 regularly disposed in a two-dimensional array on the substrate 50. The image pickup area 43 is also composed of an effective pixel area 49 and an OB pixel area 48. In this case, the effective pixel area 49 can accumulate therein the signal electric charges which are generated through the photoelectric conversion for the light actually received. Also, the OB pixel areas 48 are formed in the circumference (on the both sides) of the effective pixel area 49, and output a value of optical black becoming a reference of a black level.

The control circuit 61 generates a clock signal, a control signal, and the like which become a reference for operations of the vertical drive circuit 44, the column signal processing circuit 45, the horizontal drive circuit 46, and the like in accordance with a vertical synchronous signal, a horizontal synchronous signal, and a master clock. Also, the clock signal, the control signal, and the like which are all generated in the control circuit 61 are inputted to the vertical drive circuit 44, the column signal processing circuit 45, the horizontal drive circuit 46, and the like.

The vertical drive circuit 44, for example, is composed of a shift register, and successively selects and scans the pixels 42 of the image pickup area 43 in rows in the vertical direction. Also, the vertical drive circuit 44 supplies the pixel signals based on the signal electric charges generated in the photoelectric conversion portions of the respective pixels 42 to the column signal processing circuits 45 through respective vertical signal lines 60.

The column signal processing circuits 45, for example, are disposed every column of the pixels 42. The column signal processing circuits 45 executes predetermined pieces of signal processing such as noise removal and signal amplification for the signals outputted from the pixels 42 for one row every column by using the signals from the OB pixel area 48. A horizontal selection switch (not shown) is provided between an output stage of the column signal processing circuits 45, and a horizontal signal line 62.

The horizontal drive circuit 46, for example, is composed of a shift register. The horizontal drive circuit 46 successively outputs horizontal scanning pulses to select the column signal processing circuits 45 in order, thereby causing the pixel signals to be outputted from the column signal processing circuits 45 to the horizontal signal line 62.

The outputting circuit 47 executes the signal processing for the pixel signals successively supplied thereto from the column signal processing circuits 45 through the horizontal signal line 62.

4-2 Structures of Main Portions

Figure 27A:
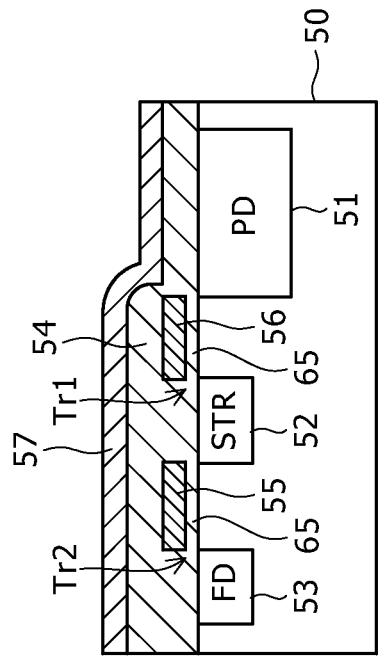
FIGS. 27A and 27B are respectively cross sectional views showing structures of an effective pixel area and an OB pixel area of the CMOS type solid-state image pickup device according to the fourth embodiment of the present disclosure.
Figure 27B:
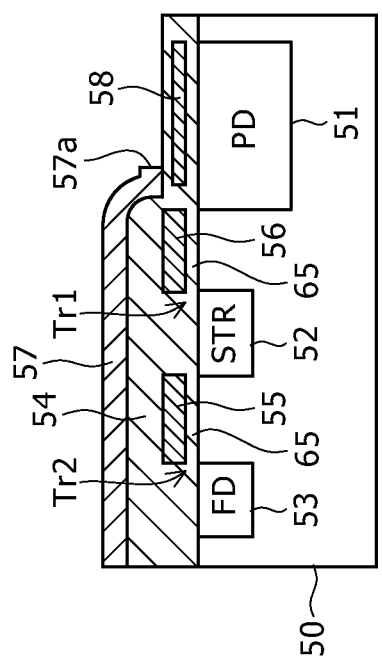

FIGS. 27A and 27B are respectively cross sectional views showing structures of main portions of an effective pixel area 49 and an OB pixel area 48 in the CMOS type solid-state image pickup device 41 of the fourth embodiment. Also, FIGS. 27A and 27B show the cross sectional views on behalf of a part of transistors composing the pixel 42. In addition, the CMOS type solid-state image pickup device 41 of the fourth embodiment is a CMOS type solid-state image pickup device having a global shutter function.

As shown in FIGS. 27A and 27B, the CMOS type solid-state image pickup device 41 of the fourth embodiment includes the substrate 50, an anti-reflection film 58 and a light blocking film 57 which are formed above an upper portion of the substrate 50 in the effective pixel area 49.

The substrate 50 is composed of a silicon substrate made of silicon. Also, the substrate 50 includes a photoelectric conversion portion 51 composed of a photodiode, a transfer transistor Tr1, and a transistor Tr2 for selection and reading on a light incidence side.

The photoelectric conversion portion 51 is formed by implanting desired impurity ions to the light incidence side of the substrate 50, and generates the signal electric charges corresponding to a quantity of incident light.

The transfer transistor Tr1 is composed of an electric charge accumulating portion 52 and a transfer gate electrode 56. In this case, the electric charge accumulating portion 52 is composed of a desired impurity region formed on the substrate 50. Also, the transfer gate electrode 56 is formed on the substrate 50 through a gate insulating film 65 formed from a silicon oxide film. The electric charge accumulating portion 52 is formed adjacent to the photoelectric conversion portion 51 of corresponding one of the pixels 42, and is also formed by implanting the desired impurity ions to the light incidence side of the substrate 50. With the transfer transistor Tr1, the signal electric charges generated and accumulated in the photoelectric conversion portions 51 are read out from all of the pixels 42 at the same time to be accumulated in the electric charge accumulating portions 52.

The transistor Tr2 for selection and reading is composed of a floating diffusion portion 53 and a reading-out gate electrode 55. In this case, the floating diffusion portion 53 is composed of a desired impurity region formed on the substrate 50. Also, the reading-out gate electrode 55 is formed on the substrate 50 through a gate insulating film 65 formed from a silicon oxide film. The floating diffusion portion 53 is formed adjacent to the electric charge accumulating portion 52, and is also firmed by implanting desired impurity ions. With the transistors Tr2 for selection and reading, the signal electric charges accumulated in the electric charge accumulating portions 52 are selectively read out to the floating diffusion portions 53.

Although FIGS. 27A and 27B show the transfer transistor Tr1 and the transistor Tr2 for selection and reading of plural pixel transistors, in addition thereto, a reset transistor, an amplification transistor, a selection transistor, and the like are formed in the same manner as that in the normal solid-state image pickup device.

The anti-reflection film 58 is selectively formed only right above the photoelectric conversion portion 51 in the effective pixel area 49. That is to say, no anti-reflection film 58 is formed in the OB pixel area 48. The same material as that in the case of the first embodiment can be used as a material for the anti-reflection film 58.

The light blocking film 57 is formed on each of the upper portions of the transfer gate electrode 56 and the reading-out gate electrode 55 through the insulating film 54 formed from the silicon oxide film. In addition, in the effective pixel area 49, the light blocking film 57 includes an opening portion 57a opening the photoelectric conversion portion 51 and is formed in an area light-blocking each of the electric charge accumulating portion 52 and the floating diffusion portion 53. On the other hand, in the OB pixel area 48, the light blocking film 57 is formed in an area light-blocking each of the photoelectric conversion portion 51, the electric charge accumulating portion 52, and the floating diffusion portion 53.

In addition thereto, although an illustration is omitted here for the sake of simplicity, a wiring layer for drive of the pixel transistors, a color filter layer, and an on-chip lens are formed in order above the upper portion of the substrate 50. A light condensed by the on-chip lens is made incident to the photoelectric conversion portion 51 of each pixel 42.

In the effective pixel area 49, the light made incident to the substrate 50 is subjected to the photoelectric conversion in the photoelectric conversion portion 51 and as a result, the signal electric charges corresponding to a quantity of incident light are generated and accumulated in the photoelectric conversion portion 51. In addition, in the OB pixel area 48, no light is made incident thereto because the portion right above the photoelectric conversion portion 51 is light-blocked by the light blocking film 57. Also, the signal electric charges accumulated in the photoelectric conversion portions 51 of the pixels 42 are transferred from all of the pixels 42 to the electric charges accumulating portions 52 at the same time by turning ON the transfer gate electrodes 56. Also, the signal electric charges transferred to the electric charge accumulating portions 52 are selectively read out to the floating diffusion portions 53 every pixel 42 by turning ON the reading-out gate electrode 55. The signal electric charges read out to the floating diffusion portions 53 are amplified by respective amplification transistors, and are then selectively discharged to the respective vertical signal lines 60 shown in FIG. 26 by the selection transistors. After that, a pixel signal is outputted in the same manner as that in the normal CMOS type solid-state image pickup device. In addition, since in the OB pixel area 48, the photoelectric conversion portion 51 is light-blocked, the pixel signal at the black level is obtained.

In the CMOS type solid-state image pickup device 41 of the fourth embodiment, since the signal electric charges accumulated in the photoelectric conversion portions 51 of all of the pixels 42 are transferred to the electric charge accumulating portions 52 at the same time, an exposure time can be set at the same time in all of the pixels 42. Therefore, it is possible to realize the global shutter function free from a difference in exposure accumulation time.

As described above, in the CMOS type solid-state image pickup device 41 having the global shutter function, when the light is made incident to the electric charge accumulating portion 52 while the electric charges are accumulated in the electric charge accumulating portion 52, there is the possibility that the electric potential of the electric charge accumulating portion 52 is changed, and thus it may be impossible to obtain the precise pixel signal. Therefore, for the purpose of preventing the leakage of the light to the electric charge accumulating portion 52, preferably, the light blocking film 57 is formed closer to the electric charge accumulating portion 52. Also, in such a case, as shown in FIGS. 27A and 27B, in the OB pixel area 48, a distance between the substrate 50 and the light blocking film 57 light-blocking the photoelectric conversion portion 51 also needs to be made small. In such a case, in the OB pixel area 48, as shown in FIGS. 27A and 27B, since the light blocking film 57 right above the photoelectric conversion portion 51 is light-blocked, the distance between the light blocking film 57 and the surface of the substrate 50 becomes small. Therefore, when the electric potential is applied to the light blocking film 57, there is the possibility that the dark current is generated in the photoelectric conversion portion 51 in the OB pixel area 48 due to the influence of application of the electric potential.

However, the CMOS type solid-state image pickup device of the fourth embodiment adopts the structure in which in the OB pixel area 48, no anti-reflection film 58 is formed between the light blocking film 57 and the substrate 50, and only the silicon oxide film is formed between the light blocking film 57 and the substrate 50. For this reason, it is possible to prevent the electric charges from being charged in the layer between the substrate 50 and the light blocking film 57 due to the influence of the light blocking film 57, and it is also possible to suppress the generation of the dark current in the OB pixel area 48.

The present disclosure can be applied not only to the solid-state image pickup device for detecting a distribution of quantities of incident visible light, and capturing the distribution thus detected in the form of an image, but also to a solid-state image pickup device for capturing a distribution of quantities of incidence of an infrared ray, an X-ray, particles or the like in the form of an image. In addition, in the broad sense, the present disclosure can also be applied across the broad of solid-state image pickup devices (physical amount distribution detectors) such as a fingerprint detecting sensor for detecting a distribution of other physical amounts such as a pressure and an electrostatic capacitance, and capturing the distribution of other physical amounts in the form of an image.

In addition, the present disclosure is by no means limited to the solid-state image pickup device for scanning the unit pixels in the pixel portion in rows in order, and reading out the pixel signals from the unit pixels. That is to say, the present disclosure can also be applied to an X-Y address type solid-state image pickup device for selecting arbitrary pixels in pixels, and reading out signals from the arbitrary pixels thus selected in pixels.

It is noted that the solid-state image pickup device either may have a form of being formed in the form of one chip, or may have a module-like form, having an image capturing function, in which a pixel portion and a signal processing portion or an optical system are collectively packaged.

In addition, the present disclosure is by no means limited to the application to the solid-state image pickup device, and thus can also be applied to an image pickup apparatus. Here, the image pickup apparatus means an electronic apparatus, having an image capturing function, such as a camera system such as a digital still camera or a video camera, or a mobile phone. It is noted that the above module-like form installed in the electronic apparatus, that is, a camera module is meant as the image pickup apparatus in some cases.

5. Fifth Embodiment

Electronic Apparatus

Figure 28:
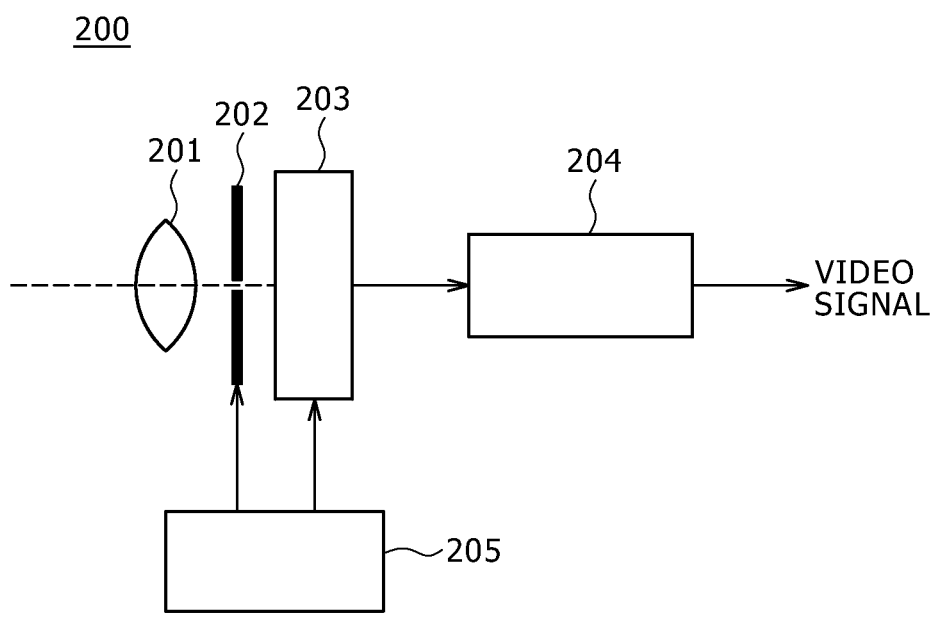
FIG. 28 is a block diagram showing a configuration of an electronic apparatus according to a fifth embodiment of the present disclosure.

Next, an electronic apparatus according to a fifth embodiment of the present disclosure will be described in detail. FIG. 28 is a block diagram showing a schematic configuration of an electronic apparatus 200 according to the fifth embodiment of the present disclosure.

The electronic apparatus 200 of the fifth embodiment includes a solid-state image pickup device 203, an optical lens 201, a shutter device 202, a drive circuit 205, and a signal processing circuit 204. The electronic apparatus 200 of the fifth embodiment shows the embodiment when the above CCD type solid-state image pickup device 1 according to the first embodiment of the present disclosure is used as the solid-state image pickup device 203 in the electronic apparatus (camera).

The optical lens 201 images an image light (incident light) from a subject on an imaging area of the solid-state image pickup device 203. As a result, signal electric charges are accumulated in the solid-state image pickup device 203 for a given period of time.

The shutter device 202 controls both of a period of time for light radiation and a period of time for light-blocking for the solid-state image pickup device 203.

The drive circuit 205 supplies a drive signal in accordance with which both of a transfer operation of the solid-state image pickup device 203 and a shutter operation of the shutter device 202 are controlled. The signal transfer from the solid-state image pickup device 203 is carried out in accordance with the drive signal (timing signal) supplied from the drive circuit 205. The signal processing circuit 204 executes various kinds of signal processing. A video signal for which the signal processing is executed either is stored in a recording media such as a memory, or is outputted to a monitor.

In the electronic apparatus 200 of the fifth embodiment, since the suppression of generation of the dark current in the OB pixel area is realized in the solid-state image pickup device 203, the image quality is enhanced.

The electronic apparatus 200 to which the CCD type solid-state image pickup device 1 can be applied is by no means limited to the camera, and thus can be applied to an image pickup apparatus such as a digital still camera or a camera module for a mobile apparatus such as a mobile phone.

Although the electronic apparatus 200 of the fifth embodiment adopts the configuration in which the CCD type solid-state image pickup device 1 of the first embodiment is used as the solid-state image pickup device 203, it goes without saying that any of the solid-state image pickup devices of the second to fourth embodiments can also be used in the electronic apparatus 200.

The present disclosure contains subject matter related to that disclosed in Japanese Priority Patent Application JP 2011-014520 filed in the Japan Patent Office on Jan. 26, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image pickup device, comprising:
    a photoelectric conversion portion formed on a substrate and composed of a photodiode;
    an image pickup area having plural pixels respectively including a reading-out electrode configured to read out signal electric charges generated and accumulated in said photoelectric conversion portion; and
    a light blocking film having an opening portion above said photoelectric conversion portion in an effective pixel area of said image pickup area, and light-blocking said photoelectric conversion portion in an optical black pixel area of said image pickup area,
    wherein a film located between said light blocking film and said substrate right above said photoelectric conversion portion in said optical black pixel area is composed of only a silicon oxide film,
    wherein an anti-reflection film is located only within a silicon oxide film layer above said photoelectric conversion portion formed in said effective pixel area.

2. The solid-state image pickup device according to claim 1, wherein said light blocking film is connected to said reading-out electrode, and serves as a control wiring as well through which a desired electric potential is supplied to said reading-out electrode.

3. The solid-state image pickup device according to claim 1, wherein said light blocking film in said optical black pixel area is formed in a position farther from said substrate than said light blocking film surrounding said photoelectric conversion portion in said effective pixel area.

4. The solid-state image pickup device according to claim 1, wherein each of said reading-out electrode and said light blocking film is made of a material selected from the group including W, Al, Ru, or an alloy thereof.

5. The solid-state image pickup device according to claim 1, wherein a barrier metal film made of a metallic material and having a lamination structure of two or more layers is formed in a lower layer of each of said reading-out electrode and said light blocking film.

6. An electronic apparatus, comprising:
    an optical lens;
    a solid-state image pickup device including
        a photoelectric conversion portion formed on a substrate and composed of a photodiode,
        an image pickup area having plural pixels respectively including a reading-out electrode configured to read out signal electric charges generated and accumulated in said photoelectric conversion portion, and
        a light blocking film having an opening portion above said photoelectric conversion portion in an effective pixel area of said image pickup area, and light-blocking said photoelectric conversion portion in an optical black pixel area of said image pickup area,
        a film located between said light blocking film and said substrate being formed from only a silicon oxide film in said optical black pixel area, in which a light condensed by said optical lens is made incident to said solid-state image pickup device,
        wherein an anti-reflection film is located only within a silicon oxide film layer above said photoelectric conversion portion formed in said effective pixel area; and
    a signal processing circuit processing an output signal outputted from said solid-state image pickup device.

7. The electronic apparatus according to claim 6, wherein said light blocking film is connected to said reading-out electrode, and serves as a control wiring as well through which a desired electric potential is supplied to said reading-out electrode.

8. The electronic apparatus according to claim 6, wherein said light blocking film in said optical black pixel area is formed in a position farther from said substrate than said light blocking film surrounding said photoelectric conversion portion in said effective pixel area.

9. The electronic apparatus according to claim 6, wherein each of said reading-out electrode and said light blocking film is made of a material selected from the group including W, Al, Ru, or an alloy thereof.

10. The electronic apparatus according to claim 6, wherein a barrier metal film made of a metallic material and having a lamination structure of two or more layers is formed in a lower layer of each of said reading-out electrode and said light blocking film.

* * * * *